United States Patent
Tanimoto et al.

(10) Patent No.: US 9,395,626 B2
(45) Date of Patent: Jul. 19, 2016

(54) PHOTOSENSITIVE RESIN COMPOSITION, METHOD FOR MANUFACTURING PATTERNED CURED FILM, AND ELECTRONIC COMPONENT

(71) Applicant: HITACHI CHEMICAL COMPANY, LTD., Tokyo (JP)

(72) Inventors: Akitoshi Tanimoto, Ibaraki (JP); Shigeru Nobe, Ibaraki (JP); Kei Kasuya, Ibaraki (JP); Hiroshi Matsutani, Ibaraki (JP); Shigeki Katogi, Ibaraki (JP); Yu Aoki, Ibaraki (JP); Shingo Tahara, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 60 days.

(21) Appl. No.: 14/364,498

(22) PCT Filed: Oct. 31, 2012

(86) PCT No.: PCT/JP2012/078176
§ 371 (c)(1),
(2) Date: Jun. 11, 2014

(87) PCT Pub. No.: WO2013/088852
PCT Pub. Date: Jun. 20, 2013

(65) Prior Publication Data
US 2014/0322635 A1  Oct. 30, 2014

(30) Foreign Application Priority Data

Dec. 13, 2011  (JP) ................. P2011-272307

(51) Int. Cl.
| | | |
|---|---|---|
| *G03F 7/00* | (2006.01) | |
| *G03F 7/075* | (2006.01) | |
| *G03F 7/004* | (2006.01) | |
| *G03F 7/022* | (2006.01) | |
| *G03F 7/023* | (2006.01) | |

(52) U.S. Cl.
CPC ............ *G03F 7/0755* (2013.01); *G03F 7/0045* (2013.01); *G03F 7/0226* (2013.01); *G03F 7/0233* (2013.01); *G03F 7/0236* (2013.01)

(58) Field of Classification Search
CPC ... G03F 7/0045; G03F 7/0226; G03F 7/0236; G03F 7/0233
USPC ...................... 430/18, 270.1, 281.1, 325, 326
See application file for complete search history.

(56) References Cited

U.S. PATENT DOCUMENTS

2011/0254178 A1*  10/2011  Matsutani ............ G03F 7/0233
257/788

FOREIGN PATENT DOCUMENTS

| JP | 2003-215802 A | 7/2003 |
|---|---|---|
| JP | 2008-241798 A | 10/2008 |
| JP | 2010-096927 A | * 4/2010 |
| JP | 2010-256508 A | 11/2010 |
| JP | 2011-075610 A | 4/2011 |
| JP | 2011-128276 A | 6/2011 |
| WO | 2010/073948 A1 | 7/2010 |
| WO | 2010/026988 A1 | 11/2010 |

OTHER PUBLICATIONS

Computer-generated transaltion of JP 2010-096927 (Apr. 2010).*
Computer-generated transaltion of JP 2011-075610 (Apr. 2011).*
Computer-generated transaltion of JP 2011-128276 (Jun. 2011).*
Partial translation of JP 2010-096927 (Apr. 2010).*
International Search Report issued in corresponding application PCT/JP2012/078176, completed Nov. 19, 2012 and mailed Nov. 27, 2012.
Matsutani, Hiroshi et al., "Low Temperatue Curing of Polyimide Precursors by Variable Frequen.cy Microwave," Journal of Photopolymer Science and Technology, vol. 18, No. 2, 2005, pp. 327-332.
English translation of International Preliminary Report on Patentability completed Jun. 17, 2014 and mailed Jun. 26, 2014.

* cited by examiner

Primary Examiner — John A McPherson
(74) Attorney, Agent, or Firm — Griffin and Szipl PC

(57) ABSTRACT

There is provided a photosensitive resin composition containing (A) an alkali-soluble resin, (B) a compound which generates an acid when exposed to light, (C) a thermal crosslinking agent, and (D) a nitrogen-containing aromatic compound represented by the following formula (1):

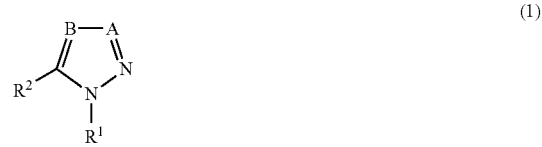

(1)

wherein $R^1$ represents a hydrogen atom or a hydrocarbon group; $R^2$ represents a hydrogen atom, an amino group or a phenyl group; and A and B each independently represent a nitrogen atom, or a carbon atom and a hydrogen atom bonded thereto.

13 Claims, 7 Drawing Sheets

PHOTOSENSITIVE RESIN COMPOSITION, METHOD FOR MANUFACTURING PATTERNED CURED FILM, AND ELECTRONIC COMPONENT

TECHNICAL FIELD

The present invention relates to a photosensitive resin composition, a method for manufacturing a patterned cured film, and an electronic component.

This is a National Phase Application in the U.S. of International Patent Application No. PCT/JP2012/078176 filed Oct. 31, 2012, which claims priority on Japanese Patent Application No. P2011-272307, filed Dec. 13, 2011. The entire disclosures of the above patent applications are hereby incorporated by reference.

BACKGROUND ART

It is demanded accompanying high integration, miniaturization and micronization of semiconductor elements that photosensitive resin compositions used for formation of surface protecting layers, interlayer insulating layers and rewiring layers of the semiconductor elements simultaneously have better sensitivity and resolution, and are capable of forming more fine and precise patterned cured films. As a material simultaneously having such properties, a photosensitive resin composition containing an alkali-soluble resin having a phenolic hydroxyl group is developed (see, for example, Patent Literature 1). Such a photosensitive resin composition has an advantage of being capable of being thermally cured at a low temperature in a step of heating and curing a patterned resin film formed through light exposure and development.

CITATION LIST

Patent Literature

Patent Literature 1: Japanese Patent Application Laid-Open No. 2003-215802
Patent Literature 2: Japanese Patent Application Laid-Open No. 2010-256508

SUMMARY OF INVENTION

Technical Problem

Further in recent years, accompanying high integration and miniaturization of semiconductor elements, the surface area of wiring composed of gold, copper, Ni or the like to the surface area of the semiconductor element has increased. Therefore, photosensitive resin compositions used for formation of surface protecting layers, interlayer insulating layers and rewiring layers of semiconductor elements need to have excellent adherence with such wiring. However, conventional photosensitive resin compositions do not always have sufficient adherence with wiring. Then, a method of using two types of resins having a phenolic hydroxyl group, and other methods are proposed (see, for example, Patent Literature 2). However, photosensitive resin compositions developed so far, though being excellent in mechanical properties, are demanded to be further improved in terms of the crack resistance after a thermal shock cycle test. Further, it is difficult to achieve the good adherence with substrates regardless of types of the substrates such as gold (Au), copper (Cu), titanium (Ti) and silicon (Si).

Then, it is an object of the present invention to provide a photosensitive resin composition which is capable of forming a patterned cured film having excellent crack resistance and having good adherence with various types of substrates, and which is developable with an alkali aqueous solution.

Solution to Problem

The present invention relates to a photosensitive resin composition containing (A) an alkali-soluble resin, (B) a compound which generates an acid when exposed to light, (C) a thermal crosslinking agent, and (D) a nitrogen-containing aromatic compound represented by the following formula (1).

[Chemical Formula 1]

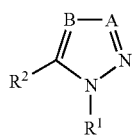

(1)

In the formula, $R^1$ represents a hydrogen atom or a hydrocarbon group; $R^2$ represents a hydrogen atom, an amino group or a phenyl group; and A and B each independently represent a nitrogen atom, or a carbon atom and a hydrogen atom bonded thereto (C—H).

The photosensitive resin composition according to the present invention is capable of forming a patterned cured film having excellent crack resistance and having good adherence with various types of substrates. The photosensitive resin composition is further developable with an alkali aqueous solution.

The (D) component may be a nitrogen-containing aromatic compound represented by the following formula (2). Thereby, the advantageous effects of the present invention can be achieved particularly remarkably. $R^2$ in the formula (2) is the same as $R^2$ in the formula (1).

[Chemical Formula 2]

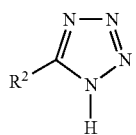

(2)

The (A) component may be a phenol resin. The (A) component may contain a phenol resin (A1) having no unsaturated hydrocarbon group and a modified phenol resin (A2) having an unsaturated hydrocarbon group. The (A2) component may be a modified phenol resin further modified by a reaction of a phenolic hydroxyl group with a polybasic acid anhydride.

The (B) component may be an o-quinone diazide compound.

The photosensitive resin composition according to the present invention may further contain (E) a silane compound represented by the following formula (3).

[Chemical Formula 3]

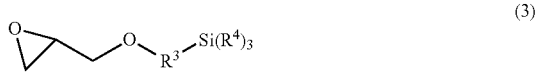

(3)

In the formula (3), $R^3$ represents a divalent organic group; and $R^4$ represents a monovalent organic group, and a plurality of $R^4$ in the same molecule may be identical or different.

The photosensitive resin composition according to the present invention may further contain (F) an acryl resin.

The present invention relates also to a method for manufacturing a patterned cured film, the method comprising a step of applying and drying the photosensitive resin composition on a substrate to thereby form a photosensitive resin film, a step of exposing the photosensitive resin film, a step of developing the photosensitive resin film after the exposure with an alkali aqueous solution to thereby form a patterned resin film, and a step of heating the patterned resin film.

The present invention relates further to an electronic component having a patterned cured film obtained by the manufacturing method as a surface protecting layer, an interlayer insulating layer, a cover coat layer, a core, a collar or an underfill.

Advantageous Effects of Invention

The present invention can provide a photosensitive resin composition which is capable of forming a patterned cured film having excellent crack resistance and having good adherence with substrates regardless of types thereof, and which is developable with an alkali aqueous solution. The patterned cured film composed of the photosensitive resin composition according to the present invention has good photosensitive properties (sensitivity and resolution), and has sufficient mechanical properties (elongation at break and elastic modulus). The photosensitive resin composition according to the present invention, since being capable of being cured at a low temperature, can prevent damage due to heat to electronic components and can then provide highly reliable electronic components in a high yield.

DESCRIPTION OF EMBODIMENTS

Figure 1:
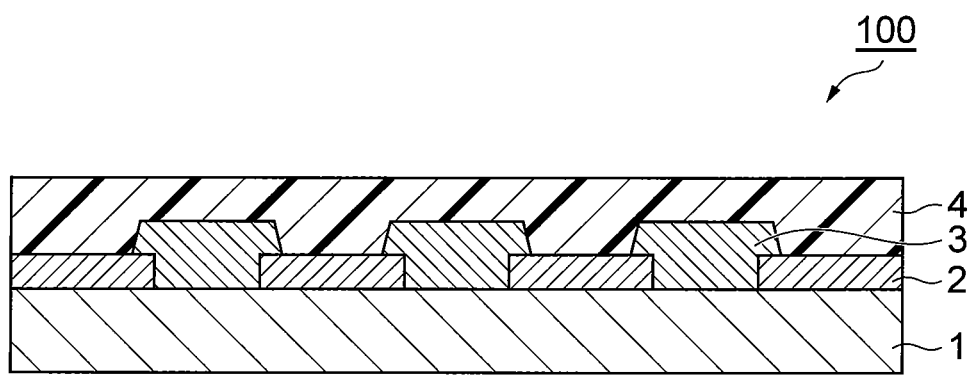
FIG. 1 is a schematic cross-sectional diagram illustrating one embodiment of a manufacturing process of a semiconductor apparatus.

Hereinafter, preferred embodiments according to the present invention will be described in detail. However, the present invention is not limited to the following embodiments. In the present description, a "(meth)acrylate" refers to an "acrylate" and a "methacrylate" corresponding thereto. A "(meth)acryl" similarly refers to an "acryl" and a "methacryl" corresponding thereto.

[Photosensitive Resin Composition]

The photosensitive resin composition according to the present invention contains (A) an alkali-soluble resin, (B) a compound which generates an acid when exposed to light, (C) a thermal crosslinking agent and (D) a nitrogen-containing aromatic compound represented by the following formula (1).

[Chemical Formula 4]

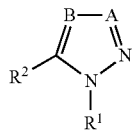

(1)

$R^1$ represents a hydrogen atom or a hydrocarbon group; $R^2$ represents a hydrogen atom, an amino group or a phenyl group; and A and B each independently represent a nitrogen atom, or a carbon atom and a hydrogen atom bonded thereto.

<(A) Component: An Alkali-Soluble Resin>

An alkali-soluble resin as an (A) component is soluble to an alkali aqueous solution. One criterion that an (A) component is soluble to an alkali aqueous solution will be described as follows. A solution obtained from the (A) component singly and any solvent, or a solution obtained from the (A) component, a (B) component, a (C) component and a (D) component, and any solvent is rotationally applied on a substrate such as a silicon wafer to thereby form a resin film of about 5 μm in thickness. The resin film is immersed in any one of a tetramethylammonium hydroxide aqueous solution, a metal hydroxide aqueous solution and an organic amine aqueous solution at 20 to 25° C. As a result, the case where the resin is dissolved to thereby form a homogeneous solution gives such a judgment that the (A) component is soluble to the alkali aqueous solution.

The (A) component specifically includes hydroxystyrene-based resins such as polyhydroxystyrenes and copolymers containing hydroxystyrene as a monomer unit, phenol resins, polybenzoxazol precursors such as poly(hydroxyamides), poly(hydroxyphenylene) ethers, and polynaphthols. Among these, phenol resins are preferable, and novolac-type phenol resins are more preferable, because these are of a low cost and exhibit only a small volume shrinkage in curing.

Phenol resins are polycondensation products of phenol or derivatives thereof with aldehydes. The polycondensation is carried out in the presence of a catalyst such as an acid or a base. Phenols resins obtained in the case of using an acid catalyst are called novolac-type phenol resins. Specific examples of novolac-type phenol resins include phenol/formaldehyde novolac resins, cresol/formaldehyde novolac resins, xylylenol/formaldehyde novolac resins, resorcinol/formaldehyde novolac resins, and phenol-naphthol/formaldehyde novolac resins.

Examples of phenol derivatives used for obtaining phenol resins include: alkylphenols such as phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol; alkoxyphenols such as methoxyphenol and 2-methoxy-4-methylphenol; alkenylphenols such as vinylphenol and allylphenol; aralkylphenols such as benzylphenol; alkoxycarbonylphenols such as methoxycarbonylphenol; arylcarbonylphenols such as benzoyloxyphenol; halogenated phenols such as chlorophenol; polyhydroxybenzenes such as catechol, resorcinol and pyrogallol; bisphenols such as bisphenol A and bisphenol F; naphthol derivatives such as α- or β-naphthol; hydroxyalkylphenols such as p-hydroxyphenyl-2-ethanol, p-hydroxyphenyl-3-propanol and p-hydroxyphenyl-4-butanol; hydroxyalkylcresols such as hydroxyethylcresol; monoethylene oxide adducts of bisphenols; alcoholic hydroxyl group-containing phenol derivatives such as monopropylene oxide adducts of bisphenols; and carboxyl group-containing phenol derivatives such as p-hydroxyphenylacetic acid, p-hydroxyphenylpropionic acid, p-hydroxyphenylbutanoic acid, p-hydroxycinnamic acid, hydroxybenzoic acid, hydroxyphenylbenzoic acid, hydroxyphenoxybenzoic acid and diphenols. Methylolated substances of the phenol derivatives such as bishydroxymethyl-p-cresol may be used as phenol derivatives.

Phenol resins further may be products obtained by polycondensing the above-mentioned phenol or phenol derivatives together with compounds other than phenol such as m-xylene, with aldehydes. In this case, it is preferable that the molar ratio of the compounds used for polycondensation other than phenol to the phenol derivatives is lower than 0.5. The above-mentioned phenol derivatives and the compounds other than phenol are each used singly or in a combination of two or more.

Aldehydes used for obtaining phenol resins are selected, for example, from formaldehyde, acetaldehyde, furfural, benzaldehyde, hydroxybenzaldehyde, methoxybenzaldehyde, hydroxyphenylacetaldehyde, methoxyphenylacetaldehyde, crotonaldehyde, chloroacetaldehyde, chlorophenylacetaldehyde, glyceraldehyde, glyoxylic acid, methyl glyoxylate, phenyl glyoxylate, hydroxyphenyl glyoxylate, formylacetic acid, methyl formylacetate, 2-formylpropionic acid, methyl 2-formylpropionate, and the like. Additionally, paraformaldehydes, precursors of formaldehyde such as trioxane, and ketones such as acetone, pyruvic acid, lepulinic acid, 4-acetylbutyric acid, acetonedicarboxylic acid and 3,3'-4,4'-benzophenonetetracarboxylic acid may be used for the reaction. These are used singly or in a combination of two or more.

Poly(hydroxystyrene)-based resins are obtained, for example, by polymerizing (vinyl polymerizing)ethylenic unsaturated double bonds of hydroxystyrene having a protecting group incorporated therein in the presence of a catalyst (radical initiator), and further deprotecting the protecting group. A commercially available branch-type poly(hydroxystyrene) such as PHS-B (trade name, made by Du Pont) may also be used.

In consideration of the balance among the solubility to an alkali aqueous solution, photosensitive properties and mechanical properties, it is preferable that the weight-average molecular weight of an (A) component is 500 to 150000; 500 to 100000 is more preferable; and 1000 to 50000 is still more preferable. Here, the weight-average molecular weight is a value obtained by the measurement using gel permeation chromatography, and the conversion using a standard polystyrene calibration curve.

It is preferable that the (A) component contains a phenol resin (A1) having no unsaturated hydrocarbon group and a modified phenol resin (A2) having an unsaturated hydrocarbon group. It is more preferable that the (A2) component is a modified phenol resin further modified by a reaction of a phenolic hydroxyl group with a polybasic acid anhydride.

The (A2) component is generally: a polycondensation product of aldehydes with a reaction product (hereinafter referred to as "unsaturated hydrocarbon group-modified phenol derivative") of a phenol or a derivative thereof with a compound having an unsaturated hydrocarbon group (preferably a compound having 4 to 100 carbon atoms; hereinafter simply referred to as "unsaturated hydrocarbon group-containing compound" in some cases); or a reaction product of a phenol resin with an unsaturated hydrocarbon group-containing compound. For the phenol derivatives used for obtaining the (A2) component, the same phenol derivatives and aldehydes as used for obtaining phenol resins can be used.

It is preferable from the viewpoint of the adherence and the thermal shock resistance of a patterned cured film that the unsaturated hydrocarbon group-containing compound contains two or more unsaturated bonds, and it is preferable from the viewpoint of the storage stability of the resin composition that the number of the unsaturated bonds is 30 or less. From the viewpoint of the compatibility when the resin composition is made, and the flexibility of the cured film, it is preferable that the number of carbon atoms of the unsaturated hydrocarbon group-containing compound is 8 to 80; and 10 to 60 is more preferable.

Examples of the unsaturated hydrocarbon group-containing compound are unsaturated hydrocarbons having 4 to 100 carbon atoms, polybutadienes having carboxyl groups, epoxidated polybutadienes, linoleyl alcohol, oleyl alcohol, unsaturated fatty acids, and unsaturated fatty acid esters. Suitable unsaturated fatty acids include crotonic acid, myristoleic acid, palmitoleic acid, oleic acid, elaidic acid, vaccenic acid, gadoleic acid, erucic acid, nervonic acid, linolic acid, α-linoleic acid, eleostearic acid, stearidonic acid, arachidonic acid, eicosapentaenoic acid, clupanodonic acid, and docosahexaenoic acid. Among these, vegetable oils being unsaturated fatty acid esters are especially preferable.

The vegetable oils are generally esters of glycerol with unsaturated fatty acids, and include nondrying oils having an iodine value of 100 or lower, semidrying oils having that of higher than 100 and lower than 130, and drying oils having that of 130 or higher. Examples of the nondrying oil include olive oil, morning glory seed oil, cashew nut oil, sasanqua oil, camellia oil, castor oil, and peanut oil. Examples of the semidrying oil include corn oil, cotton seed oil, and sesame oil. Examples of the drying oil include tung oil, linseed oil, soybean oil, walnut oil, safflower oil, sunflower oil, perilla oil, and poppy seed oil. Processed vegetable oils obtained by processing these vegetable oils may be used.

Among these vegetable oils, it is preferable from the viewpoint of the improvement in the adherence, the mechanical properties and the thermal shock resistance of a patterned cured film that drying oils are used. Among the drying oils, tung oil, linseed oil, soybeen oil, walnut oil and safflower oil are more preferable, and tung oil and linseed oil are still more preferable, because these oils can effectively and surely exhibit the advantageous effects of the present invention. These vegetable oils are used singly or in a combination of two or more.

In the preparation of an (A2) component, first, the phenol derivative and the unsaturated hydrocarbon group-containing compound are allowed to react to thereby prepare an unsaturated hydrocarbon group-modified phenol derivative. It is preferable that the reaction is usually carried out at 50 to 130° C. It is preferable that the blend proportion of the phenol derivative and the unsaturated hydrocarbon group-containing compound is 1 to 100 parts by mass of the unsaturated hydrocarbon group-containing compound to 100 parts by mass of the phenol derivative; and 5 to 50 parts by mass is more preferable, because the flexibility of a patterned cured film can be improved. The reaction may use, as required, as a catalyst p-toluenesulfonic acid, trifluoromethanesulfonic acid or the like.

Then, the unsaturated hydrocarbon group-modified phenol derivative and aldehydes are allowed to react to thereby prepare a modified phenol resin having an unsaturated hydrocarbon group being an (A2) component. The reaction of the aldehydes with the unsaturated hydrocarbon group-modified phenol derivative is a polycondensation reaction, and can use the conventionally well-known synthesis condition of phenol resins. Additionally, an (A2) component can also be obtained by combining a compound other than a phenol such as m-xylene with a compound obtained by reacting the above-mentioned phenol derivative with an unsaturated hydrocarbon group-containing compound, and polycondensing this with aldehydes. The presence of the unsaturated hydrocarbon group in the (A2) component at the ortho positions or the para positions to the phenolic hydroxyl group of the phenol resin is preferable, and the presence thereof at the para positions is more preferable.

An (A2) component can be obtained also by allowing the above-mentioned phenol resin and the unsaturated hydrocarbon group-containing compound to react. It is preferable that the reaction of the phenol resin with the unsaturated hydrocarbon group-containing compound is usually carried out at 50 to 130° C. It is preferable that the blend proportion of the phenol derivative and the unsaturated hydrocarbon group-containing compound is 1 to 100 parts by mass of the unsaturated hydrocarbon group-containing compound to 100 parts by mass of the phenol resin; and 5 to 50 parts by mass is more preferable, because the flexibility of a patterned cured film can be improved. At this time, as required, p-toluenesulfonic acid, trifluoromethanesulfonic acid or the like may be used as a catalyst. The reaction can use a solvent such as toluene, xylene, methanol or tetrahydrofurn.

A phenol resin acid-modified by allowing the phenolic hydroxyl group present in the (A2) component to further react with a polybasic acid anhydride can also be used as an (A2) component. Acid-modification with a polybasic acid anhydride allows the introduction of a carboxyl group, and the further improvement in the solubility of the (A2) component to an alkali aqueous solution (developing solution).

The polybasic acid anhydride is not especially limited as long as having an acid anhydride group formed by dehydrating-condensing carboxyl groups of a polybasic acid having a plurality of the carboxyl groups. Examples of the polybasic acid anhydride include dibasic acid anhydrides such as phthalic anhydride, succinic anhydride, octenylsuccinic anhydride, pentadodecenylsuccinic anhydride, maleic anhydride, itaconic anhydride, tetrahydrophthalic anhydride, hexahydrophthalic anhydride, methyltetrahydrophthalic anhydride, methylhexahydrophthalic anhydride, nadic anhydride, 3,6-endomethylene tetrahydrophthalic anhydride, methylendomethylene tetrahydrophthalic anhydride, tetrabromophthalic anhydride and trimellitic anhydride, and aromatic tetrabasic acid dianhydrides such as biphenyltetracarboxylic dianhydride, naphthalenetetracarboxylic dianhydride, diphenyl ether tetracarboxylic dianhydride, butanetetracarboxylic dianhydride, cyclopentanetetracarboxylic dianhydride, pyromellitic anhydride and benzophenonetetracarboxylic dianhydride. These may be used singly or in a combination of two or more. Among these, it is preferable that the polybasic acid anhydride is a dibasic acid anhydride; and it is more preferable that the polybasic acid anhydride is one or more selected from the group consisting of tetrahydrophthalic anhydride, succinic anhydride and hexahydrophthalic anhydride. This case has an advantage of being capable of forming a patterned cured film having a further good shape.

The reaction of the phenolic hydroxyl group with the polybasic acid anhydride can be carried out at 50 to 130° C. In the reaction, it is preferable that 0.1 to 0.8 mol of the polybasic acid anhydride is allowed to react with 1 mol of the phenolic hydroxyl group; 0.15 to 0.6 mol of the polybasic acid anhydride is more preferable; and 0.2 to 0.4 mol of the polybasic acid anhydride is still more preferable. If the polybasic acid anhydride is less than 0.1 mol, the developability is likely to decrease; and if that exceeds 0.8 mol, the alkali resistance of unexposed portions is likely to decrease.

The reaction, as required, may be carried out in the presence of a catalyst from the viewpoint of rapidly carrying out the reaction. The catalyst includes tertiary amines such as triethylamine, quarternary ammonium salts such as triethylbenzylammonium chloride, imidazole compounds such as 2-ethyl-4-methylimidazole, and phosphorus compounds such as triphenylphosphine.

It is preferable that the acid value of a phenol resin further modified with a polybasic acid anhydride is 30 to 200 mgKOH/g; 40 to 170 mgKOH/g is more preferable; and 50 to 150 mgKOH/g is still more preferable. If the acid value is lower than 30 mgKOH/g, the alkali development is likely to require a long time as compared with the case of the acid value in the above-mentioned range; and If exceeding 200 mgKOH/g, the developing solution resistance of unexposed portions is likely to decrease as compared with the case of the acid value in the above-mentioned range.

In consideration of the balance among the solubility to an alkali aqueous solution, photosensitive properties and physical properties of a cured film, it is preferable that the weight-average molecular weight of the (A2) component is 1000 to 500000; 2000 to 200000 is more preferable; and 2000 to 100000 is still more preferable. Here, the weight-average molecular weight is a value obtained by the measurement using gel permeation chromatography, and the conversion using a standard polystyrene calibration curve.

In the case of using a photosensitive resin composition by mixing a modified phenol resin (A2) having an unsaturated hydrocarbon group as an (A) component, from the viewpoint of the sensitivity and the resolution when a patterned resin film is formed, and the adherence, the mechanical properties and the thermal shock resistance of a patterned cured film after being cured, it is preferable that the mass ratio of a phenol resin (A1) having no unsaturated hydrocarbon group and the modified phenol resin (A2) having an unsaturated hydrocarbon group contained in the (A) component is, with the total amount of the both being taken to be 100, the former: the latter=5:95 to 95:5; the mass ratio thereof of 10:90 to 90:10 is more preferable; and the mass ratio thereof of 15:85 to 85:15 is most preferable.

<(B) Component: A Compound which Generates an Acid when Exposed to Light>

A compound which generates an acid when exposed to light as a (B) component is used as a photosensitizer. The (B) component generates an acid when exposed to light irradiation, and has a function of increasing the solubility of light-irradiated portions to an alkali aqueous solution. As the (B) component, a compound generally called a photoacid generating agent can be used. Specific examples of the (B) component include o-quinone diazide compounds, aryldiazonium salts, diaryliodonium salts and triarylsulfonium salts. Among these, o-quinone diazide compounds are preferable because being highly sensitive.

o-Quinone diazide compounds are obtained, for example, by a method in which o-quinone diazidesulfonyl chloride and a hydroxyl compound and/or an amino compound, and the like are allowed to condensation-react in the presence of a dehydrochlorinating agent.

Examples of o-quinone diazidesulfonyl chloride used in the reaction include benzoquinone-1,2-diazide-4-sulfonyl chloride, naphthoquinone-1,2-diazide-5-sulfonyl chloride, and naphthoquinone-1,2-diazide-4-sulfonyl chloride.

Examples of the hydroxyl compound used in the reaction include hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, tris(4-hydroxyphenyl)ethane, 1,1-bis(4-hydroxyphenyl)-1-[4-{1-(4-hydroxyphenyl)-1-methylethyl}phenyl]ethane.

Examples of the amino compound used in the reaction include p-phenylenediamine, m-phenylenediamine, 4,4'-diaminodiphenyl ether, 4,4'-diaminodiphenylmethane, 4,4'-diaminodiphenylsulfone, 4,4'-diaminodiphenylsulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl) sulfone, bis(4-amino-3-hydroxyphenyl) sulfone, bis(3-amino-4-hydroxyphenyl)hexafluoropropane, bis(4-amino-3-hydroxyphenyl)hexafluoropropane.

Among these, from the viewpoint of the absorption wavelength range and the reactivity, preferable are a substance obtained by allowing 1,1-bis(4-hydroxyphenyl)-1-[4-{1-(4-hydroxyphenyl)-1-methylethyl}phenyl]ethane and 1-naphthoquinone-2-diazide-5-sulfonyl chloride to condensation-react, and a substance obtained by allowing tris(4-hydroxyphenyl)methane or tris(4-hydroxyphenyl)ethane and 1-naphthoquinone-2-diazide-5-sulfonyl chloride to condensation-react.

The dehydrochlorinating agent used in the reaction includes sodium carbonate, sodium hydroxide, sodium hydrogenecarbonate, potassium carbonate, potassium hydroxide, trimethylamine, triethylamine, and pyridine. As the reaction solvent, dioxane, acetone, methyl ethyl ketone, tetrahydrofuran, diethyl ether, N-methylpyrrolidone, and the like are used.

It is preferable that o-quinone diazidesulfonyl chloride and a hydroxyl compound and/or an amino compound are blended so that the total of the numbers of moles of a hydroxyl group and an amino group is 0.5 to 1 with respect to 1 mol of o-quinone diazidesulfonyl chloride. The preferable blend proportion of the dehydrochlorinating agent to o-quinone diazidesulfonyl chloride is in the range of 0.95/1 mol equivalent to 1/0.95 mol equivalent.

The preferable reaction temperature for the above-mentioned reaction is 0 to 40° C., and the preferable reaction time is 1 to 10 hours.

It is preferable that the content of a (B) component is 3 to 100 parts by mass with respect to 100 parts by mass of an (A) component; 5 to 50 parts by mass is more preferable; and 5 to 30 parts by mass is still more preferable, because the dissolving speed difference between exposed portions and unexposed potions becomes large, making the sensitivity better.

<(C) Component: A Thermal Crosslinking Agent>

A thermal crosslinking agent is a compound having a structure capable of reacting with an (A) component and forming a crosslinked structure when a photosensitive resin film after pattern formation is heated and cured. This can prevent the brittleness of a film and the melt of the film. Thermal crosslinking agents are preferable which are selected, for example, from compounds having a phenolic hydroxyl group, compounds having a hydroxymethylamino group and compounds having an epoxy group.

The compounds having a phenolic hydroxyl group used as the thermal crosslinking agent are different from the (A) component, and the specific structure thereof includes ones described later. Such a compound having a phenolic hydroxyl group is preferable not only because being used as a thermal crosslinking agent, but also because being capable of increasing the dissolution speed of exposed portions when being developed with an alkali aqueous solution, and thereby improving the sensitivity. The molecular weight of such a compound having a phenolic hydroxyl group is preferably 2000 or lower. In consideration of the balance among the solubility to an alkali aqueous solution, the photosensitive properties and the physical properties of a cured film, it is preferable that the number-average molecular weight is 94 to 2000; 108 to 2000 thereof is more preferable; and 108 to 1500 thereof is still more preferable.

As the compound having a phenolic hydroxyl group, conventionally well-known ones can be used, but a compound represented by the following formula (4) is especially preferable because of being excellent in the balance between the effect of promoting the dissolution of exposed portions and the effect of preventing the melt of a photosensitive resin film in curing.

[Chemical Formula 5]

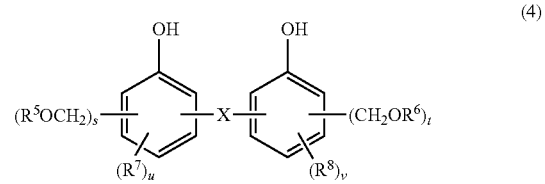

(4)

In the formula (4), X represents a single bond or a divalent organic group; $R^5$, $R^6$, $R^7$ and $R^8$ each independently represent a hydrogen atom or a monovalent organic group; and s and t each independently represent an integer of 1 to 3, and u and v each independently represent an integer of 0 to 4.

In the formula (4), compounds in which X is a single bond are biphenol (dihydroxybiphenyl) derivatives. Divalent organic groups represented by X include alkylene groups having 1 to 10 carbon atoms such as a methylene group, an ethylene group and a propylene group, alkylidene groups having 2 to 10 carbon atoms such as an ethylidene group, arylene groups having 6 to 30 carbon atoms such as a phenylene group, groups in which a part or the whole of a hydrogen atom of these hydrocarbon groups is substituted with a halogen atom such as a fluorine atom, a sulfonyl group, a carbonyl group, an ether bond, a thioether bond, and an amide bond.

Compounds having a hydroxymethylamino group include nitrogen-containing compounds in which the whole or a part of an active methylol group of (poly)(N-hydroxymethyl)

melamine, (poly)(N-hydroxymethyl)glycoluril, (poly)(N-hydroxymethyl)benzoguanamine, (poly)(N-hydroxymethyl)urea or the like is alkyl-etherified. Here, alkyl groups in the alkyl ethers include a methyl group, an ethyl group, a butyl group and a mixture thereof, and oligomer components partially self-condensed may be contained. The compounds specifically include hexakis(methoxymethyl)melamine, hexakis(butoxymethyl)melamine, tetrakis(methoxymethyl)glycoluril, tetrakis(butoxymethyl)glycoluril, and tetrakis(methoxymethyl)urea.

As the compound having an epoxy group, conventionally well-known ones can be used. Specific examples thereof include bisphenol A epoxy resins, bisphenol F epoxy resins, phenol novolac-type epoxy resins, cresol novolac-type epoxy resins, alicyclic epoxy resins, glycidylamines, heterocyclic epoxy resins, and polyalkylene glycol diglycidyl ethers.

As the (C) component, other than the above-mentioned substances, there can be used aromatic compounds having a hydroxymethyl group such as bis[3,4-bis(hydroxymethyl)phenyl]ether and 1,3,5-tris(1-hydroxy-1-methylethyl)benzene, compounds having a maleimide group such as bis(4-maleimidephenyl)methane and 2,2-bis[(4-(4'-maleimidephenoxy)phenyl)]propane, compounds having a norbornene skeleton, polyfunctional acrylate compounds, compounds having an oxetanyl group, compounds having a vinyl group, and blocked isocyanate compounds.

Among the above-mentioned (C) components, compounds having a phenolic hydroxyl group and compounds having a hydroxymethylamino group are preferable from the viewpoint of being capable of more improving the sensitivity and the heat resistance; and from the viewpoint of being capable of more improving the resolution and the elongation of a coated film as well, compounds having a hydroxymethylamino group are more preferable; compounds having an alkoxymethylamino group in which the whole or a part of hydroxymethylamino groups is alkyl-etherified are especially preferable; and compounds having an alkoxymethylamino group in which the whole of hydroxymethylamino groups is alkyl-etherified are most preferable. Among the compounds having an alkoxymethylamino group in which the whole of hydroxymethylamino groups is alkyl-etherified, particularly a compound represented by the following formula (5) is preferable.

[Chemical Formula 6]

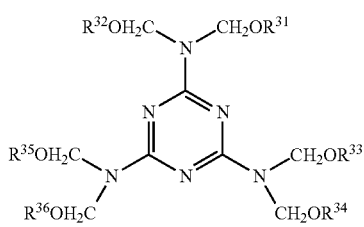

(5)

In the formula (5), $R^{31}$ to $R^{36}$ each independently represent an alkyl group having 1 to 10 carbon atoms.

From the viewpoint that the dissolution speed difference between exposed portions and unexposed portions becomes large and the sensitivity becomes good, and from the viewpoint of properties of a cured film, it is preferable that the blend amount of a (C) component is 1 to 50 parts by mass with respect to 100 parts by mass of an (A) component; 2 to 30 parts by mass is more preferable; and 3 to 25 parts by mass is still more preferable. The above-mentioned thermal crosslinking agents are used singly or in a combination of two or more.

<(D) Component: A Nitrogen-Containing Aromatic Compound Represented by the Formula (1)>

A photosensitive resin composition according to the present embodiment contains a nitrogen-containing aromatic compound having a structure represented by the following formula (1).

[Chemical Formula 7]

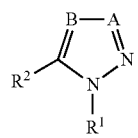

(1)

$R^1$ represents a hydrogen atom or a hydrocarbon group; $R^2$ represents a hydrogen atom, an amino group or a phenyl group; and A and B each independently represent a nitrogen atom, or a carbon atom and a hydrogen atom bonded thereto (C—H).

The incorporation of a (D) component can provide a photosensitive resin composition providing a patterned cured film which can be improved in the crack resistance after the thermal shock cycle test and is good in the adherence with substrates regardless of types of the substrates.

It is preferable from the viewpoint of more improving the adherence with substrates that the (D) component is a nitrogen-containing aromatic compound represented by the following formula (2).

[Chemical Formula 8]

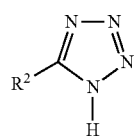

(2)

$R^2$ represents a hydrogen atom, a hydrocarbon group, an amino group or a phenyl group.

Such a (D) component includes 1H-tetrazole, 5-aminotetrazole, 5-phenyltetrazole and 5-methyltetrazole, and among these, 1H-tetrazole and 5-aminotetrazole are preferable from the viewpoint of imparting better adherence with substrates.

From the viewpoint of imparting the good adherence with substrates and the sensitivity, it is preferable that the blend amount of a nitrogen-containing aromatic compound represented by the above formula (1) as the (D) component is 0.01 to 20 parts by mass with respect to 100 parts by mass of an (A) component; 0.015 to 10 parts by mass is more preferable; and 0.02 to 7 parts by mass is still more preferable.

<(E) Component: A Silane Compound>

A photosensitive resin composition according to the present embodiment may contain as an (E) component a silane compound having an epoxy group represented by the formula (3) from the viewpoint of improving the adherence with substrates.

[Chemical Formula 9]

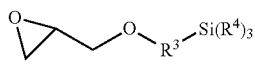
(3)

In the formula (3), $R^3$ represents a divalent organic group; and the $R^4$ group represents a monovalent organic group. A plurality of $R^4$ in the same molecule may be identical or different.

In the formula (3), it is preferable from the viewpoint of the improvement of the sensitivity and the resolution that $R^3$ is a straight-chain alkyl group represented by —$(CH_2)_n$— (n is an integer of 1 to 6). It is preferable from the viewpoint of the improvement of the sensitivity and the resolution that $R^4$ is an alkoxy group or an alkoxyalkyl group. Among these, it is especially preferable from the viewpoint of the inexpensive availability and the improvement of the adhesion with substrates that $R^4$ is an alkoxy group such as a methoxy group or an ethoxy group. Such a compound includes 3-glycidoxypropyltrimethoxysilane and 3-glycidoxypropyltriethoxysilane.

A photosensitive resin composition according to the present embodiment may further contain, other than a silane compound as the (E) component represented by the formula (3), a silane compound different therefrom. Examples of such a silane compound include Ureidopropyltriethoxysilane, vinyltriethoxysilane, γ-glycidoxypropyltriethoxysilane, γ-methacryloxypropyltrimethoxysilane, urea propyltriethoxysilane, methylphenylsilanediol, ethylphenylsilanediol, n-propylphenylsilanediol, isopropylphenylsilanediol, n-butyldiphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxysilyObenzene, 1,4-bis(methyldihydroxysilyl)benzene, 1,4-bis(ethyldihydroxysilyl)benzene, 1,4-bis(propyldihydroxysilyObenzene, 1,4-bis(butyldihydroxysilyObenzene, 1,4-bis(dimethylhydroxysilyl)benzene, 1,4-bis(diethylhydroxysilyl)benzene, 1,4-bis(dipropylhydroxysilyl)benzene, 1,4-bis(dibutylhydroxysilyl)benzene. These silane compounds are used singly or in a combination of two or more. A photosensitive resin composition according to the present embodiment is further improved in the adherence with various types of substrates by concurrently using a nitrogen-containing aromatic compound represented by the formula (2) and a silane compound having an epoxy group represented by the formula (3) or the above-mentioned silane compound.

From the viewpoint of the adhesion with wiring and the storage stability of the photosensitive resin composition, it is preferable that the total amount of the (E) component and a silane compound other than the (E) component is 0.1 to 20 parts by mass with respect to 100 parts by mass of an (A) component; 0.5 to 10 parts by mass is more preferable; and 1 to 5 parts by mass is still more preferable.

<(F) Component>

A photosensitive resin composition according to the present embodiment may contain an acryl resin as an (F) component. It is preferable that the acryl resin has a structural unit represented by the following formula (6) or (7). The incorporation of an acryl resin having a structural unit represented by the formula (6) or (7), while maintaining good photosensitive properties, can improve the thermal shock resistance. The (F) component may be composed of only one type of the acryl resin, or may contain two or more types thereof.

[Chemical Formula 10]

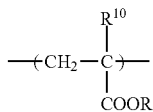
(6)

[Chemical Formula 11]

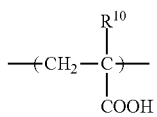
(7)

In the formulae (6) and (7), $R^9$ represents an alkyl group having 4 to 20 carbon atoms, and $R^{10}$ represents a hydrogen atom or a methyl group.

In the formula (6), from the viewpoint of being capable of improving the sensitivity, the resolution and the thermal shock resistance, it is preferable that $R^9$ is an alkyl group having 4 to 16 carbon atoms; and an alkyl group having 4 carbon atoms, particularly n-butyl group, is more preferable.

A polymerizable monomer imparting a structural unit represented by the formula (6) includes alkyl(meth)acrylates. An example of the alkyl(meth)acrylates include a compound represented by the following formula (8).

$$CH_2=C(R^{11})—COOR^{12} \quad (8)$$

In the formula (8), $R^{11}$ represents a hydrogen atom or a methyl group; and $R^{12}$ represents an alkyl group having 4 to 20 carbon atoms. Examples of the alkyl group having 1 to 20 carbon atoms represented by $R^{12}$ include a butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, and constitutional isomers thereof. Examples of a polymerizable monomer represented by the above formula (8) include butyl(meth)acrylate, pentyl(meth)acrylate, hexyl(meth)acrylate, heptyl(meth)acrylate, octyl(meth)acrylate, nonyl(meth)acrylate, decyl(meth)acrylate, undecyl(meth)acrylate, dodecyl(meth)acrylate, tridecyl(meth)acrylate, tetradecyl(meth)acrylate, pentadecyl(meth)acrylate, hexadecyl(meth)acrylate, heptadecyl(meth)acrylate, octadecyl(meth)acrylate, nonadecyl(meth)acrylate, and eicosyl(meth)acrylate. These polymerizable monomers are used singly or in a combination of two or more.

A polymerizable monomer imparting a structural unit represented by the formula (7) includes acrylic acid and methacrylic acid.

In the (F) component, it is preferable that the compositional ratio of a structural unit represented by the above formula (6) is 50 to 95 mol % with respect to the total amount of an (F) component; 60 to 90 mol % is more preferable; and 70 to 85 mol % is especially preferable. That the compositional ratio of a structural unit represented by the above formula (6) is 50 to 95 mol % can more improve the thermal shock resistance of a cured film of the photosensitive resin composition.

In an acryl resin as the (F) component, it is preferable that the compositional ratio of a structural unit represented by the above formula (7) is 5 to 35 mol % with respect to the total amount of an (F) component; 10 to 30 mol % is more preferable; and 15 to 25 mol % is still more preferable. That the compositional ratio of a structural unit represented by the above formula (7) is 5 to 35 mol % can more improve the compatibility with an (A) component and the developability of the photosensitive resin composition.

From the viewpoint of being capable of improving the compatibility with an (A) component, and the adherence with substrates, the mechanical properties and thermal shock resistance of a patterned cured film, it is more preferable that an (F) component contains an acryl resin having a structural unit represented by the above formula (6), a structural unit represented by the above formula (7), and a structural unit represented by the following formula (9). That the (F) component is the acryl resin makes good the interaction between the (F) component and an alkali-soluble resin having a phenolic hydroxyl group, and more improves the compatibility.

[Chemical Formula 12]

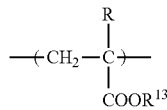

(9)

In the formula (9), R represents a hydrogen atom or a methyl group; and $R^{13}$ represents a monovalent organic group having a primary, secondary or tertiary amino group.

Examples of a polymerizable monomer imparting a structural unit represented by the formula (9) include aminoethyl (meta)acrylate, N-methylaminoethyl(meta)acrylate, N,N-dimethylaminoethyl(meta)acrylate, N-ethylaminoethyl (meta)acrylate, N,N-diethylaminoethyl(meta)acrylate, aminopropyl(meta)acrylate, N-methylaminopropyl(meta) acrylate, N,N-dimethylaminopropyl(meta)acrylate, N-ethylaminopropyl(meta)acrylate, N,N-diethylaminopropyl (meta)acrylate, aminoethyl(meta)acrylamide, N-methylaminoethyl(meta)acrylamide, N,N-dimethylaminoethyl(meta)acrylamide, N-ethylaminoethyl(meta)acrylamide, N,N-diethylaminoethyl(meta)acrylamide, aminopropyl(meta)acrylamide, N-methylaminopropyl(meta) acrylamide, N,N-dimethylaminopropyl(meta)acrylamide, N-ethylaminopropyl(meta)acrylamide, N,N-diethylaminopropyl(meta)acrylamide, piperidin-4-yl(meta)acrylate, 1-methylpiperidin-4-yl(meta)acrylate, 2,2,6,6-tetramethylpiperidin-4-yl(meta)acrylate, 1,2,2,6,6-pentamethylpiperidin-4-yl(meta)acrylate, (piperidin-4-yl)methyl(meta)acrylate, 2-(piperidin-4-yl)ethyl(meta)acrylate. These polymerizable monomer are used singly or in a combination of two or more. Among these, from the viewpoint of being capable of improving the adherence with substrates, the mechanical properties and the thermal shock resistance of a resist pattern, it is especially preferable that $R^{13}$ in the formula (9) is a monovalent organic group represented by the following formula (10).

[Chemical Formula 13]

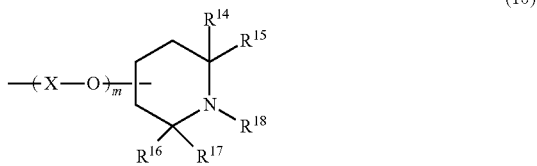

(10)

In the formula (10), X represents an alkylene group having 1 to 5 carbon atoms; $R^{14}$ to $R^{18}$ each independently represent a hydrogen atom or an alkyl group having 1 to 20 carbon atoms; and m is an integer of 0 to 10.

Examples of a polymerizable monomer imparting a structural unit of the formula (9) whose $R^{13}$ is a monovalent organic group represented by the above formula (10) include piperidin-4-yl(meta)acrylate, 1-methylpiperidin-4-yl(meta) acrylate, 2,2,6,6-tetramethylpiperidin-4-yl(meta)acrylate, 1,2,2,6,6-pentamethylpiperidin-4-yl(meta)acrylate, (piperidin-4-yl)methyl(meta)acrylate, 2-(piperidin-4-yl)ethyl (meta)acrylate. Among these, 1,2,2,6,6-pentamethylpiperidin-4-yl methacrylate and 2,2,6,6-tetramethylpiperidin-4-yl methacrylate are commercially available as FA-711MM and FA-712HM (both are made by Hitachi Chemical Co., Ltd.), respectively.

In an acryl resin as the (F) component, it is preferable that the compositional ratio of a structural unit represented by the above formula (9) is 0.3 to 10 mol % with respect to the total amount of the (F) component; 0.4 to 8 mol % is more preferable; and 0.5 to 7 mol % is still more preferable.

It is preferable from the viewpoint of being capable of more improving the sensitivity that the (F) component contains an acryl resin having a structural unit represented by the above formula (6), a structural unit represented by the above formula (7), and a structural unit represented by the following formula (11). Such an acryl resin may further have a structural unit represented by the above formula (9).

[Chemical Formula 14]

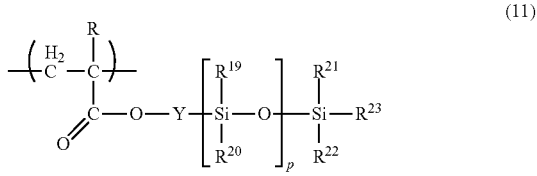

(11)

In the formula (11), R represents a hydrogen atom or a methyl group; Y represents an alkylene group having 1 to 5 carbon atoms; $R^{19}$ to $R^{23}$ each independently represent an alkyl group having 1 to 6 carbon atoms; and p is an integer of 1 to 100.

An example of a polymerizable monomer imparting a structural unit represented by the formula (11) includes methacryl-modified silicone oil, and is commercially available as X-22-174DX, X-22-2426 and X-22-2475 (any is made by Shin-Etsu Chemical Co., Ltd.).

In an acryl resin as the (F) component, it is preferable that the compositional ratio of a structural unit represented by the above formula (11) is 1 to 10 mol % with respect to the total amount of the (F) component; 2 to 5 mol % is more preferable; and 3 to 5 mol % is still more preferable.

The polymerizable monomer used for the synthesis of an acryl resin constituting an (F) component may further contain a polymerizable monomer other than the polymerizable monomers imparting the respective structural units represented by the formulae (6), (7), (9), (10) and (11). Examples of such a polymerizable monomer include styrene, α-methylstyrene, benzyl(meth)acrylate, 4-methylbenzyl(meth)acrylate, 2-hydroxyethyl(meth)acrylate, 2-hydroxypropyl(meth)acrylate, 3-hydroxypropyl(meth)acrylate, 4-hydroxybutyl(meth)acrylate, acrylonitrile, esters of vinyl alcohol such as vinyl n-butyl ether, tetrahydrofurfuryl(meth)acrylate, glycidyl(meth)acrylate, 2,2,2-trifluoroethyl(meth)acrylate, 2,2,3,3-tetrafluoropropyl(meth)acrylate, (meth)acrylic acid, α-bromo(meth)acrylic acid, α-chloro(meth)acrylic acid, β-furyl(meth)acrylic acid, β-styryl(meth)acrylic acid, maleic acid, maleic anhydride, maleic acid monoesters such as monomethyl maleate, monoethyl maleate and monoisopropyl maleate, fumaric acid, cinnamic acid, α-cyanocinnamic acid, itaconic acid, crotonic acid, and propiolic acid. These polymerizable monomers are used singly or in a combination of two or more.

It is preferable that the weight-average molecular weight of an (F) component is 2000 to 100000; 3000 to 60000 is more preferable; and 4000 to 50000 is still more preferable. If the weight-average molecular weight is lower than 2000, the thermal shock resistance of a cured film is likely to decrease; and if that exceeds 100000, the compatibility with the (A) component and the developability are likely to decrease.

In the case where an (F) component is contained, from the viewpoint of the adherence, the mechanical properties, the thermal shock resistance, and the photosensitive properties, it is preferable that the content of the (F) component is 1 to 50 parts by mass with respect to 100 parts by mass of the total amount of the (A) component; 3 to 30 parts by mass is more preferable; and 5 to 20 parts by mass is especially preferable.

<Other Components>

A photosensitive resin composition according to the present embodiment can contain, as required, other components such as a thermoacid generating agent, an elastomer, a solvent, a dissolution promoter, a dissolution inhibitor, a surfactant and a leveling agent.

<Another Component (G): A Thermoacid Generating Agent>

A photosensitive resin composition may contain (G) a thermoacid generating agent. (G) the thermoacid generating agent is a compound which generates an acid when heated, and can more suppress the melt of a pattern. This is because since an acid is allowed to be generated when a photosensitive resin film after development is heated to thereby initiate the reaction between the (A) component and the (C) component, that is, the thermal crosslinking reaction from a lower temperature, the melt of the pattern is more suppressed. Further since many of thermoacid generating agents can generate an acid also when exposed to light irradiation, if such an agent is used, the solubility of exposed portions to an alkali aqueous solution can be increased. Therefore, the difference in the solubility to an alkali aqueous solution between unexposed portions and exposed portions becomes large, thereby improving the resolution. However, a thermoacid generating agent used here is a compound different from the (B) component.

It is preferable that such a compound which generates an acid when heated is one which generates an acid when heated to a temperature of, for example, 50 to 200° C. Specific examples of compounds which generate an acid when heated are compounds different from compounds of the (B) component which generates an acid when exposed to light, and include salts formed of a strong acid and a base, such as onium salts, and imide-sulfonates, which have the function of generating an acid when heated.

Examples of such an onium salt include aryldiazonium salts; diaryliodonium salts such as diphenyliodonium salts; di(alkylaryl)iodonium salts such as diaryliodonium salts and di(t-butylphenyl)iodonium salts; trialkylsulfonium salts such as trimethylsulfonium salts; dialkylmonoarylsulfonium salts such as dimethylphenylsulfonium salts; diarylmonoalkyliodonium salts such as diphenylmethylsulfonium salts; and triarylsulfonium salts. Among these, preferable onium salts include a di(t-butylphenyl)iodonium salt of para-toluenesulfonic acid, a di(t-butylphenyl)iodonium salt of trifluoromethanesulfonic acid, a trimethylsulfonium salt of trifluoromethanesulfonic acid, a dimethylphenylsulfonium salt of trifluoromethanesulfonic acid, a diphenylmethylsulfonium salt of trifluoromethanesulfonic acid, a di(t-butylphenyl)iodonium salt of nonafluorobutanesulfonic acid, a diphenyliodonium salt of camphorsulfonic acid, a diphenyliodonium salt of ethanesulfonic acid, a dimethylphenylsulfonium salt of benzenesulfonic acid, and a diphenylmethylsulfonium salt of toluenesulfonic acid.

Among these, sulfonium salts represented by the following formula (12) are preferable; and trialkylsoufonium salts of methanesulfonic acid are more preferable; and a trimethylsulfonium salt thereof is especially preferable.

[Chemical Formula 15]

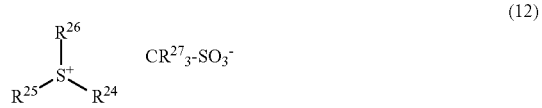

(12)

In the formula (12), $R^{24}$, $R^{25}$ and $R^{26}$ each independently represent an alkyl group or an aryl group; and $R^{27}$ represents hydrogen or fluorine. As the aryl group, a phenyl group or a phenyl group having a substituent is preferable.

Examples of the imide-sulfonates include naphthoylimide sulfonate and phthalimide sulfonate.

In the case where (G) a thermoacid generating agent is contained, it is preferable that the content of the thermoacid generating agent is 0.1 to 30 parts by mass with respect to 100 parts by mass of the total amount of the (A) component and the (B) component; 0.2 to 20 parts by mass is more preferable; and 0.3 to 10 parts by mass is still more preferable.

<Another Component (H): An Elastomer>

A photosensitive resin composition may further contain (H) an elastomer. This makes better the flexibility of an obtained patterned cured film, and can more improve the mechanical properties and the thermal shock resistance of the patterned cured film. As the elastomer, conventionally well-known ones can be used, but it is preferable that the glass transition temperature (Tg) of a polymer constituting an elastomer is 20° C. or lower.

Examples of such an elastomer include styrene-based elastomers, olefin-based elastomers, urethane-based elastomers, polyester-based elastomers, polyamide-based elastomers, and silicone-based elastomers. The elastomer may be microparticulate elastomers. These elastomers can be used singly or in a combination of two or more.

<Another Component (I): A Solvent>

A photosensitive resin composition may contain (I) a solvent from the viewpoint of the applicability on substrates and of being capable of forming a uniform-thickness resin film.

Specific examples of the solvent include γ-butyrolactone, ethyl lactate, propylene glycol monomethyl ether acetate, benzyl acetate, n-butylacetate, ethoxyethylpropionate, 3-methylmethoxypropionate, N-methyl-2-pyrrolidone, N,N-dimethylformamide, N,N-dimethylacetamide, dimethylsulfoxide, hexamethylphosphorylamide, tetramethylenesulfone, diethylketone, diisobutylketone, methylamylketone, cyclohexanone, propyleneglycolmonomethyl ether, propyleneglycolmonopropyl ether, propyleneglycolmonobutyl ether and dipropyleneglycolmonomethyl ether. These solvents can be used singly or in a combination of two or more. In the case where an (I) component is contained, the content of the (I) component is not especially limited, but it is preferable that the content is so regulated that the proportion of the solvent in the photosensitive resin composition becomes 20 to 90 mass %.

<Another Component (J): A Dissolution Promoter>

A photosensitive resin composition may contain (J) a dissolution promoter. The incorporation of (J) a dissolution promoter increases the dissolution speed of exposed portions when a patterned resin film is developed with an alkali aqueous solution, and can improve the sensitivity and the resolution. As the dissolution promoter, conventionally well-known ones can be used. Specific examples thereof include compounds having a carboxyl group, sulfonic acid or a sulfoneamide group. In the case where such a dissolution promoter is contained, the content of the dissolution promoter can be determined by the dissolution speed of a patterned resin film to an alkali aqueous solution, but it is preferable that the content is made to be 0.01 to 30 parts by mass with respect to 100 parts by mass of the (A) component.

<Another Component (K): A Dissolution Inhibitor>

A photosensitive resin composition may contain (K) a dissolution inhibitor. (K) a dissolution inhibitor is a compound to inhibit the solubility of an (A) component to an alkali aqueous solution, and is used in order to control the remaining film thickness, the development time and the contrast. Specific examples are diphenyliodonium nitrate, bis(p-tert-butylphenyl)iodonium nitrate, diphenyliodonium bromide, diphenyliodonium chloride, and diphenyliodonium iodide. In the case where a dissolution inhibitor is contained, from the viewpoint of the sensitivity and the allowable width of the development time, it is preferable that the content of the dissolution inhibitor is 0.01 to 20 parts by mass with respect to 100 parts by mass of the total amount of the (A) component; 0.01 to 15 parts by mass is more preferable; and 0.05 to 10 parts by mass is still more preferable.

<Another Component (L): A Surfactant or a Leveling Agent>

A photosensitive resin composition may contain (L) a surfactant or a leveling agent. The incorporation of an (L) component in a photosensitive resin composition can improve the applicability, for example, prevention of striation (unevenness of the film thickness), and the developability. Examples of such a surfactant or leveling agent include polyoxyethylene lauryl ether, polyoxyethylene stearyl ether, polyoxyethylene coley' ether, polyoxyethylene octylphenol ether. Commercially available products include Megaface F171, F173, R-08 (trade name, made by Dainippon Ink and Chemicals, Inc.), Fluorad FC430, FC431 (trade name, made by Sumitomo 3M Ltd.), and Organosiloxane Polymer KP341, KBM303, KBM803 (trade name, made by Shin-Etsu Chemical Co., Ltd.).

In the case where an (L) component is contained, it is preferable that the content of the (L) component is 0.001 to 5 parts by mass with respect to 100 parts by mass of the (A) component; and 0.01 to 3 parts by mass is more preferable.

A photosensitive resin composition is capable of being developed using an alkali aqueous solution of tetramethylammonium hydroxide (TMAH) or the like. Further the use of the photosensitive resin composition enables the formation of a patterned cured film having the good adherence and the crack resistance in the thermal shock cycle. A patterned cured film composed of the photosensitive resin composition according to the present invention has good photosensitive properties (sensitivity and resolution), and has sufficient mechanical properties (elongation at break and elastic modulus).

[Method for Manufacturing a Patterned Cured Film]

A method for manufacturing a patterned cured film from the photosensitive resin composition according to the above-mentioned embodiment comprises, for example, a step (film formation step) of applying and drying the photosensitive resin composition on a substrate to thereby form a photosensitive resin film, a step (exposure step) of exposing the photosensitive resin film, a step (development step) of developing the photosensitive resin film after the exposure by using an alkali aqueous solution to thereby form a patterned resin film, and a step (heating step) of heating the patterned resin film.

<Film Formation Step>

In the film formation step, the above-mentioned photosensitive resin composition is rotationally applied on a support substrate such as a glass substrate, a semiconductor, a metal oxide insulator (for example, $TiO_2$, $SiO_2$) or silicon nitride, by using a spinner or the like. The applied photosensitive resin composition is heated using a hot plate, an oven or the like to be thereby dried. A film (photosensitive resin film) of the photosensitive resin composition is thereby formed on the substrate.

<Exposure Step>

In the exposure step, the photosensitive resin film formed on the substrate is irradiated with active light rays such as ultraviolet rays, visible light rays and radiation through a mask. Since the (A) component is high in transparency to i-line, the irradiation of i-line can suitably be used. After the exposure, as required, post-exposure baking (PEB) may be carried out. It is preferable that the temperature of the post-exposure baking is 70° C. to 140° C., and that the time of the post-exposure baking is 1 min to 5 min.

<Development Step>

In the development step, exposed portions of the photosensitive resin film after the exposure step are removed by a developing solution to thereby pattern the photosensitive resin film. As the developing solution, an alkali aqueous solution, for example, of sodium hydroxide, potassium hydroxide, sodium silicate, ammonia, ethylamine, diethylamine, triethylamine, triethanolamine or tetramethylammonium hydroxide (TMAH), is suitably used. It is preferable that the concentration of a base of the aqueous solution is 0.1 to 10 mass %. Alcohols and/or a surfactant may further be added to the developing solution and used. It is preferable that each thereof can be blended in the range of 0.01 to 10 parts by mass with respect to 100 parts by mass of the developing solution; and the range of 0.1 to 5 parts by mass thereof is more preferable. The patterned photosensitive resin film is called a patterned resin film.

<Heating Step>

In the heat treatment step, the patterned resin film is heated to thereby cure the photosensitive resin composition. A film obtained by curing the patterned resin film is called a patterned cured film. In order to sufficiently prevent damage due to heat to electronic devices, it is preferable that the heating temperature is 250° C. or lower; 225° C. or lower is more preferable; and 140 to 200° C. is still more preferable. The heat treatment can be carried out, for example, using an oven such as a quartz tube oven, a hot plate, a rapid thermal annealer, a vertical diffusion oven, an infrared curing oven, an electron-beam curing oven or a microwave curing oven. Although the atmosphere for the heat treatment can be selected from either of the air and an inert atmosphere such as nitrogen, it is desirable that the heat treatment is carried out in nitrogen, because of being able to prevent the oxidation of the pattern. Since the above-mentioned desirable range of the heating temperature is lower than conventional heating temperatures, the damage to support substrates and electronic devices can be suppressed small. Therefore, by using the manufacturing method of a resist pattern according to the present embodiment, electronic devices can be manufactured in a high yield. The heating temperature leads to the energy saving of the process. The use of the photosensitive resin composition according to the present embodiment, since the volume shrinkage (curing shrinkage) in the heat treatment step, as would be seen in the use of photosensitive polyimide resins and the like, is low, can further prevent the decrease in the dimensional accuracy.

The heating time in the heating step suffices if being a time enough to cure the photosensitive resin composition, but about 5 hours or shorter is preferable in the balance with the working efficiency. The heating can also be carried out by using, in addition to the above-mentioned ovens, a microwave curing apparatus or a frequency-variable microwave curing apparatus. The use of these apparatuses allows effective heating of a photosensitive resin film alone with the temperature of substrates and electronic devices being held, for example, at 200° C. or lower.

In the frequency-variable microwave curing apparatus, since the microwave is pulsatingly irradiated while the frequency is being varied, the standing wave can be prevented, and a substrate surface can be uniformly heated, which is therefore preferable. In the case where substrates contain metal wiring as seen in electronic devices described later, if the microwave is pulsatingly irradiated while the frequency is being varied, the generation of discharge and the like from the metal can be prevented, and the electronic devices are protected from breakage, which is therefore preferable. Further if the heating using the frequency-variable microwave is carried out, physical properties of a cured film do not decrease even if the curing temperature is decreased, as compared with the case using an oven, which is therefore preferable (see J. Photopolym. Sci. Technol., 18, 327-332(2005)).

The frequency of the frequency-variable microwave is generally in the range of 0.5 to 20 GHz, but the range of 1 to 10 GHz is practically preferable; and the range of 2 to 9 GHz is practically more preferable. It is desirable that the frequency of the irradiated microwave is continuously varied, but actually, the frequency is stepwise varied for the irradiation. At this time, since the irradiation of a single-frequency microwave in as short a time as possible hardly generates the standing wave, the discharge from the metal, and the like, the irradiation time in 1 millisecond or shorter is preferable; and 100 microseconds or shorter is especially preferable.

The output of the microwave to be irradiated, depending on the size of the apparatus or the amount of an object to be heated, is in the range of about 10 to 2000 W; and practically, 100 to 1000 W is more preferable; 100 to 700 W is still more preferable; and 100 to 500 W is most preferable. With the output of 10 W or lower, the object to be heated is hardly heated in a short time; and with that exceeding 2000 W, a rapid temperature rise is liable to occur.

It is preferable that the microwave is irradiated by being pulsatingly turned on/off. The pulsating irradiation of the microwave can hold a set heating temperature, and can avoid damage to a cured film and a substrate, which is therefore preferable. The time in which the pulsating microwave is irradiated at one time depends on the condition, but about 10 second or shorter is preferable.

The above-mentioned method for manufacturing a patterned cured film can provide a photosensitive resin composition having good photosensitive properties, and can provide the patterned cured film having a good pattern shape. The use of the photosensitive resin composition according to the present embodiment allows the curing even at a low temperature of 200° C. or lower in the heating step, which conventionally needs 300° C. or higher. Additionally, a patterned cured film formed from the photosensitive resin composition according to the present invention has a high glass transition temperature. Therefore, a patterned cured film excellent in heat resistance is made. As a result, electronic devices such as semiconductor apparatuses excellent in the reliability can be provided in a high yield.

[Manufacturing Process of a Semiconductor Apparatus]

Then, as an example of the method for manufacturing a patterned cured film according to the present invention, a manufacturing process of a semiconductor apparatus will be described based on the drawings. FIGS. 1 to 5 are schematic cross-sectional diagrams showing one embodiment of a manufacturing process of a semiconductor apparatus having a multilayer wiring structure.

First, a structural body 100 shown in FIG. 1 is prepared. The structural body 100 comprises a semiconductor substrate 1 such as a Si substrate having circuit elements, a protecting film 2 such as a silicon oxide film having a predetermined pattern where the circuit elements are exposed and covering the semiconductor substrate 1, a first conductor layer 3 formed on the exposed circuit elements, and an interlayer insulating layer 4 formed as a film on the protecting layer 2 and the first conductor layer 3 by a spin coat method or the like and composed of a polyimide resin or the like.

Figure 2:
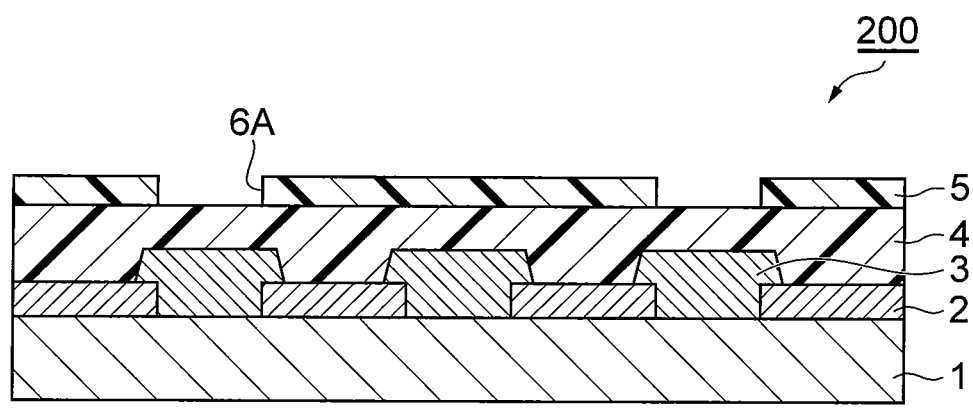
FIG. 2 is a schematic cross-sectional diagram illustrating one embodiment of a manufacturing process of the semiconductor apparatus.

Then, a photosensitive resin layer 5 having window parts 6A is formed on the interlayer insulating layer 4 to thereby obtain a structural body 200 shown in FIG. 2. The photosensitive resin layer 5 is formed by applying a photosensitive resin such as a chlorinated rubber-based, a phenol novolac-based, a polyhydroxystyrene-based or a polyacrylate ester-based one, by a spin coat method. The window parts 6A are formed by a well-known photo-lithographic technology so that predetermined portions of the interlayer insulating layer 4 are exposed.

Figure 3:
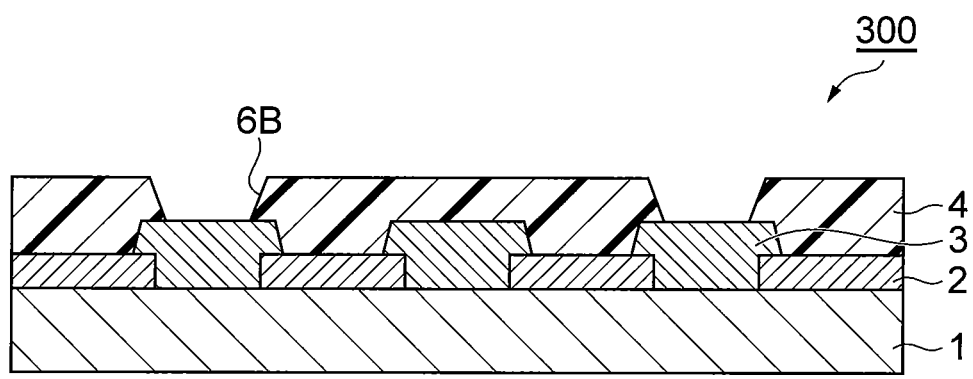
FIG. 3 is a schematic cross-sectional diagram illustrating one embodiment of a manufacturing process of the semiconductor apparatus.

The interlayer insulating layer 4 is etched to thereby form window parts 6B, and thereafter, the photosensitive resin layer 5 is removed to thereby obtain a structural body 300 shown in FIG. 3. The etching of the interlayer insulating layer 4 can use dry etching means using a gas such as oxygen or carbon tetrafluoride. By this etching, portions of the interlayer insulating layer 4 corresponding to the window parts 6A are selectively removed to thereby obtain the interlayer insulating layer 4 provided with the window parts 6B so that the first conductor layer 3 is exposed. Then, the photosensitive resin layer 5 is removed using an etching solution which does not corrode the first conductor layer 3 exposed from the window parts 6B, but corrodes the photosensitive resin layer 5 only.

Figure 4:
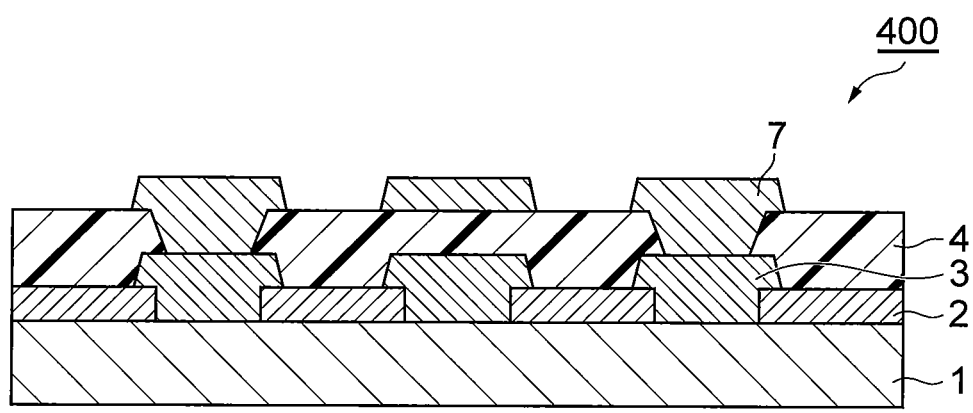
FIG. 4 is a schematic cross-sectional diagram illustrating one embodiment of a manufacturing process of the semiconductor apparatus.

A second conductor layer 7 is further formed on portions corresponding to the window parts 6B to thereby obtain a structural body 400 shown in FIG. 4. The formation of the second conductor layer 7 can use a well-known photo-lithographic technology. The second conductor layer 7 and the first conductor layer 3 are thereby electrically connected.

Figure 5:
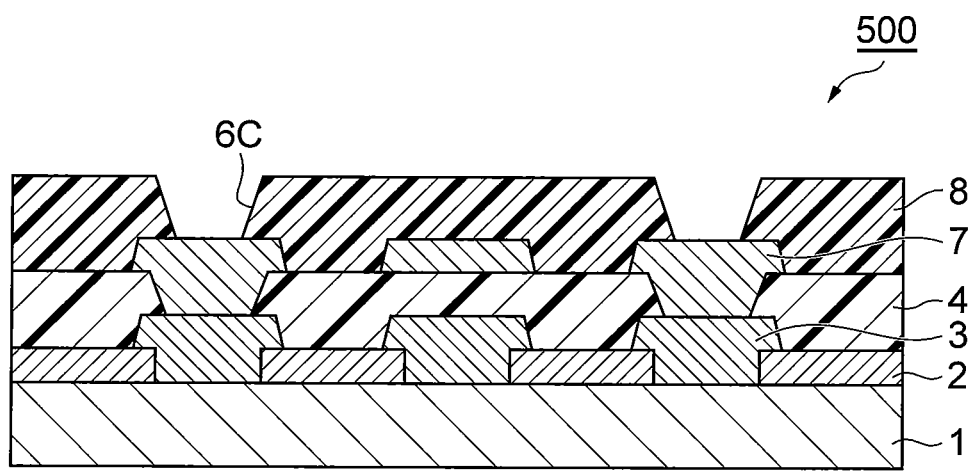
FIG. 5 is a schematic cross-sectional diagram illustrating one embodiment of a manufacturing process of the semiconductor apparatus.

Finally, a surface protecting layer 8 is formed on the interlayer insulating layer 4 and the second conductor layer 7 to thereby obtain a semiconductor apparatus 500 shown in FIG. 5. In the present embodiment, the surface protecting layer 8 is formed as follows. First, the photosensitive resin composition according to the above-mentioned embodiment is applied on the interlayer insulating layer 4 and the second conductor layer 7 by a spin coat method, and dried to thereby form a photosensitive resin film. Then, light irradiation is carried out through a mask on whose predetermined portions a pattern corresponding to window parts 6C is drawn, and thereafter, the photosensitive resin film is developed with an alkali aqueous solution to thereby pattern the photosensitive resin film. Thereafter, the photosensitive resin film is heated to be cured to thereby form a film as the surface protecting layer 8. The surface protecting layer 8 protects the first conductor layer 3 and the second conductor layer 7 from stresses from the outside, a rays and the like; and the obtained semiconductor apparatus 500 is excellent in the reliability.

In the above-mentioned embodiment, a manufacturing method of a semiconductor apparatus having a two-layer wiring structure was described, but in the case of forming a multilayer wiring structure of two or more layers, the each layer can be formed by repeatedly carrying out the above-mentioned steps. That is, a multilayer pattern is allowed to be formed by repeating the each step of forming the interlayer insulating layer 4 and the each step of forming the surface protecting layer 8. Here, in the above example, not only the surface protecting layer 8 but also the interlayer insulating layer 4 are allowed to be formed using the photosensitive resin composition according to the present embodiment.

[Electronic Component]

An electronic component according to the present embodiment has a patterned cured film formed by the above-mentioned manufacturing method as an interlayer insulating layer or a surface protecting layer. The patterned cured film can be used specifically as a surface protecting layer and/or an interlayer insulating layer of semiconductor apparatuses, an interlayer insulating layer of multilayer wiring boards, and the like. The electronic component according to the present invention is not especially limited, except for having a surface protecting layer and/or an interlayer insulating layer formed using the above-mentioned photosensitive resin composition, and can take various types of structures.

The above-mentioned photosensitive resin composition, since being excellent also in the stress relaxation, the adhesion and the like, can be used as various types of structural materials in packages of various types of structures developed in recent years. Cross-sectional structures of an example of such semiconductor apparatuses are shown in FIG. 6 and FIG. 7.

Figure 6:
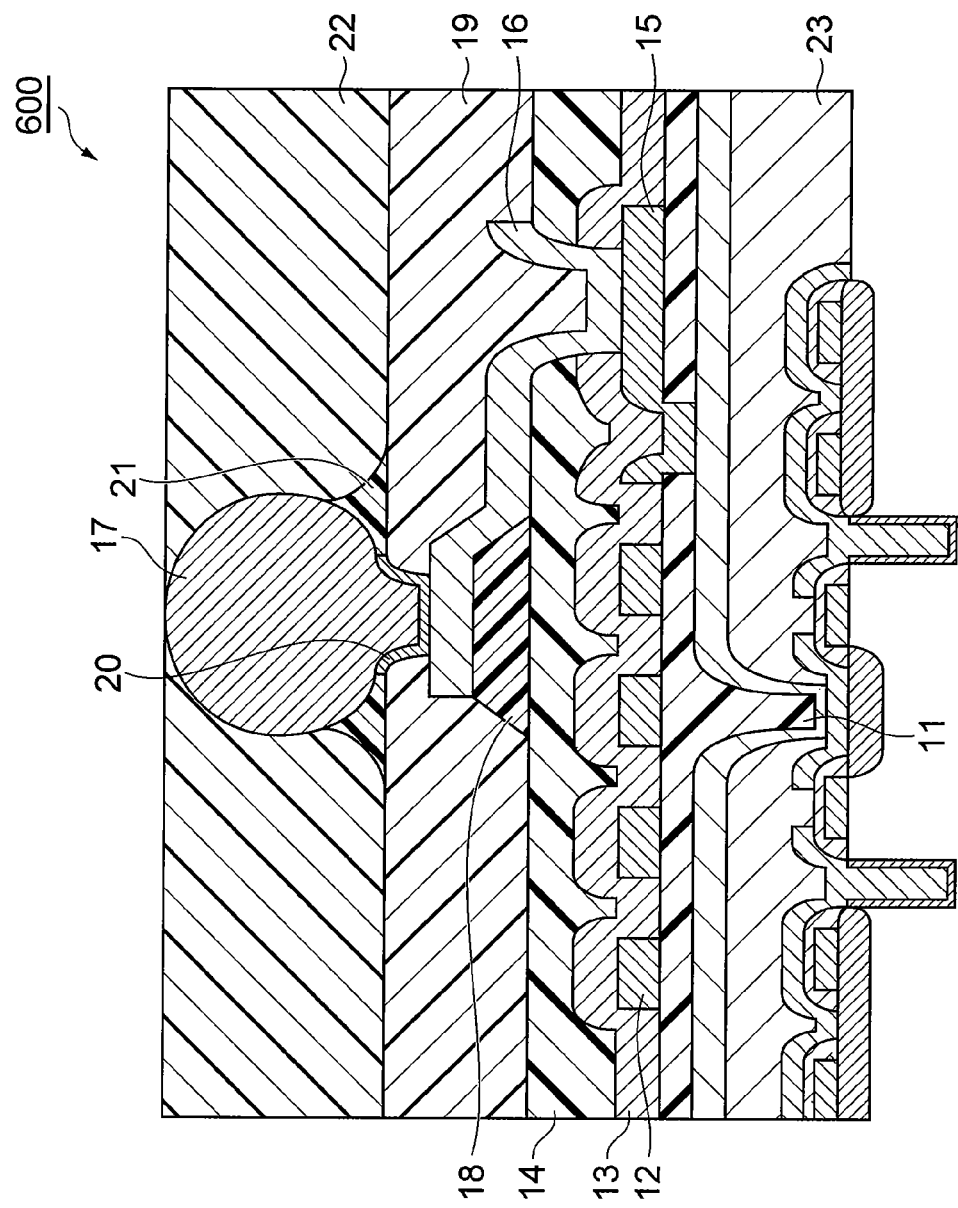
FIG. 6 is a schematic cross-sectional diagram showing one embodiment of an electronic component (semiconductor apparatus).

FIG. 6 is a schematic cross-sectional diagram showing a wiring structure as one embodiment of a semiconductor apparatus. The semiconductor apparatus 600 shown in FIG. 6 comprises a silicon chip 23, an interlayer insulating layer 11 provided on one surface side of the silicon chip 23, an Al wiring layer 12 formed on the interlayer insulating layer 11 and having a pattern containing a pad portion 15, an insulating layer 13 (for example, P-SiN layer) and a surface protecting layer 14 successively stacked on the interlayer insulating layer 11 and the Al wiring layer 12 while an opening is formed on the pad portion 15, an island-shaped core 18 disposed in the vicinity of the opening on the surface protecting layer 14, and a rewiring layer 16 extending on the surface protecting layer 14 so as to contact with the pad portion 15 in the opening of the insulating layer 13 and the surface protecting layer 14 and to contact with a surface of the core 18 on the opposite side thereof to the surface protecting layer 14. The semiconductor apparatus 600 further comprises a cover coat layer 19 formed covering the surface protecting layer 14, the core 18 and the rewiring layer 16 and having an opening formed on a portion of the rewiring layer 16 on the core 18, a conductive ball 17 connected with the rewiring layer 16 through a barrier metal 20 interposed therebetween in the opening of the cover coat layer 19, a collar 21 holding the conductive ball, and an underfill 22 provided on the cover coat layer 19 around the conductive ball 17. The conductive ball 17 is used as an external connection terminal, and is formed of a solder, gold or the like. The underfill 22 is provided in order to relax the stress when the semiconductor apparatus 600 is mounted.

Figure 7:
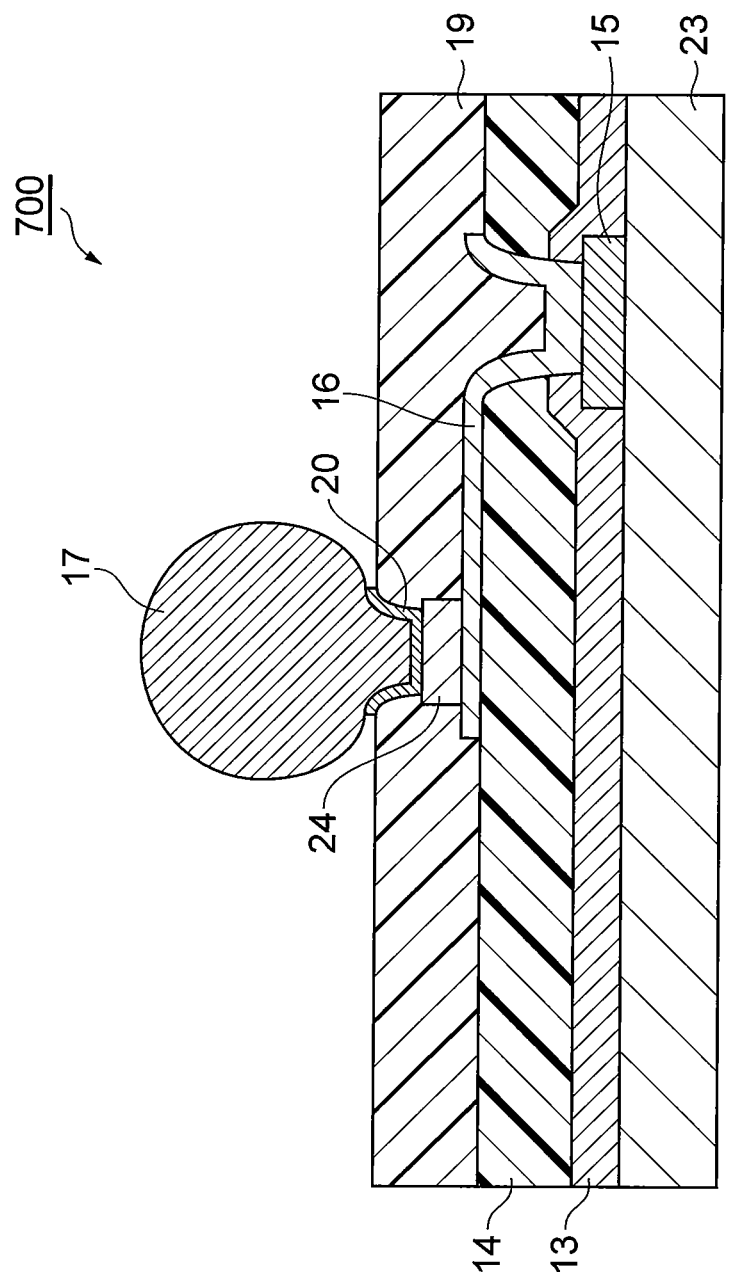
FIG. 7 is a schematic cross-sectional diagram showing one embodiment of an electronic component (semiconductor apparatus).

FIG. 7 is a schematic cross-sectional diagram showing a wiring structure as one embodiment of a semiconductor apparatus. In the semiconductor apparatus 700 of FIG. 7, an Al wiring layer (not shown in figure) and a pad portion 15 of the Al wiring layer are formed on a silicon chip 23; an insulating layer 13 is formed on the upper part thereof; and a surface protecting layer 14 for elements is further formed. A rewiring layer 16 is formed on the pad portion 15; and the rewiring layer 16 extends up to the upper part of a connection part 24 with a conductive ball 17. A cover coat layer 19 is further formed on the surface protecting layer 14. The rewiring layer 16 is connected with the conductive ball 17 through a barrier metal 20.

In the semiconductor apparatuses of FIG. 6 and FIG. 7, the above-mentioned photosensitive resin composition can be used as a material not only for forming the interlayer insulating layer 11 and the surface protecting layer 14, but also for forming the cover coat layer 19, the core 18, the collar 21, the underfill 22, and the like. Since a cured body using the above-mentioned photosensitive resin composition is excellent in the adhesion with a metal layer (for example, Cu, Au, Ni, Ti or the like) such as the Al wiring layer 12, the rewiring layer 16, a sealant and the like, and high also in the stress relaxation effect, a semiconductor apparatus using the cured body for the surface protecting layer 14, the cover coat layer 19, the core 18, the collar 21 of a solder or the like, the underfill 12 used in flip chips, and the like becomes remarkably excellent in the reliability.

It is especially suitable that the photosensitive resin composition according to the present embodiment is used for the surface protecting layer 14 and/or the cover coat layer 19 of the semiconductor apparatuses having the rewiring layer 16 in FIG. 6 and FIG. 7.

It is preferable that the film thickness of the surface protecting layer or the cover coat layer is 3 to 20 μm; and 5 to 15 μm is more preferable.

As described hitherto, the use of the above-mentioned photosensitive resin composition allows the curing using a low-temperature heating of 200° C. or lower in the above heat treatment step, which conventionally needs 300° C. or higher. In the heat treatment step, it is preferable that the heating temperature is 100° C. to 200° C.; and 150° C. to 200° C. is more preferable. The photosensitive resin composition according to the present embodiment, since the volume shrinkage (curing shrinkage) in the heat treatment step, as would be seen in the use of photosensitive polyimide and the like, is low, can further prevent the decrease in the dimensional accuracy. A patterned cured film formed from the photosensitive resin composition according to the present embodiment has a high glass transition temperature. Therefore, a surface protecting layer and an interlayer insulating layer excellent in the heat resistance are made. As a result, electronic components such as semiconductor apparatuses excellent in the reliability can be provided in a high yield.

EXAMPLES

Hereinafter, the present invention will be described in more detail by way of Examples. However, the present invention is not limited to these Examples.

<Preparation of a Photosensitive Resin Composition>

As (A) components, the following A1 and A2 were prepared.

A1: a cresol novolac resin (cresol/formaldehyde novolac resin, m-cresol/p-cresol (molecular ratio)=60/40, weight-average molecular weight in terms of polystyrene=13000, made by Asahi Organic Chemical Industry Co., Ltd., trade name: "EP4020G").

A2: a modified phenol resin prepared by a method described in the following Synthesis Example 1.

Synthesis Example 1

Synthesis of a phenol resin (A2) modified with a compound having an unsaturated hydrocarbon group and having 4 to 100 carbon atoms.

100 parts by mass of phenol, 43 parts by mass of linseed oil and 0.1 part by mass of trifluoromethanesulfonic acid were mixed, and stirred at 120° C. for 2 hours to thereby obtain a vegetable oil-modified phenol derivative (a). Then, 130 g of the vegetable oil-modified phenol derivative (a), 16.3 g of paraformaldehyde and 1.0 g of oxalic acid were mixed, and stirred at 90° C. for 3 hours. The mixture was heated to 120° C., and stirred under reduced pressure for 3 hours; and thereafter, 29 g of succinic anhydride and 0.3 g of triethylamine were added to the reaction solution, and stirred under the atmospheric pressure at 100° C. for 1 hour. The reaction solution was cooled to room temperature to thereby obtain as a reaction product a phenol resin (hereinafter, referred to as A2)(acid value: 120 mgKOH/g) modified with a compound having an unsaturated hydrocarbon group and having 4 to 100 carbon atoms. The weight-average molecular weight of the modified phenol resin A2 as determined in terms of standard polystyrenes by GPC method was about 25000.

As a (B) component, the following B1 was prepared.

B1: a 1-naphthoquinone-2-diazide-5-sulfonate ester of 1,1-bis(4-hydroxyphenyl)-1-[4-{1-(4-hydroxyphenyl)-1-methylethyl}phenyl]ethane (esterification rate: about 90%, made by AZ Electronic Materials SA, trade name: "TPPA528").

As (C) components, the following thermal crosslinking agents C1 to C3 were prepared.

C1: hexakis(methoxymethyl)melamine (made by Sanwa Chemical Co., Ltd., trade name: "Nikalac MW-30HM").

C2: 1,1-bis[(3,5-bis(methoxymethyl)-4-hydroxyphenyl)]methane (made by Honshu Chemical Industry Co., Ltd., trade name: "TMOM-pp-BPF").

C3: N,N',N'',N'''-tetrakis(methoxymethyl)glycoluril (made by Sanwa Chemical Co., Ltd., trade name: "Nikalac MX-270").

[Chemical Formula 16]

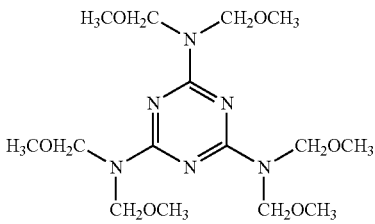
C1

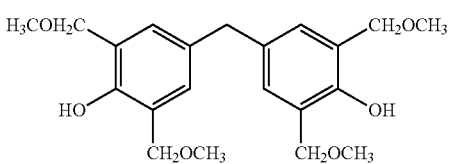
C2

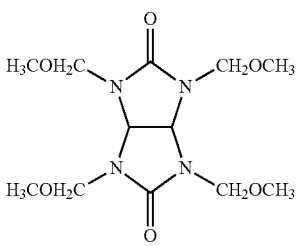
C3

As (D) components, nitrogen-containing aromatic compounds of the following D1 to D3 were prepared.

D1: tetrazole (made by Toyobo Co., Ltd., trade name: "1HT").

D2: 5-aminotetrazole (made by Toyobo Co., Ltd., trade name: "HAT").

D3: 5-phenyltetrazole (made by Toyobo Co., Ltd., trade name: "P5T").

[Chemical Formula 17]

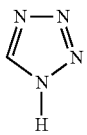
D1

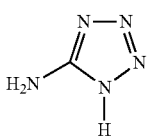
D2

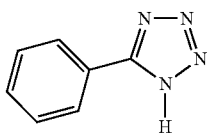
D3

As (E) components, silane compounds of the following E1 and E2 were prepared.

E1: 3-glycidoxypropyltrimethoxysilane (made by Shin-Etsu Silicone Co., Ltd., trade name: "KBM-403").

E2: ureidopropyltriethoxysilane (made by Dow Chemical Toray Co., Ltd, trade name: "AY-43-031").

[Chemical Formula 18]

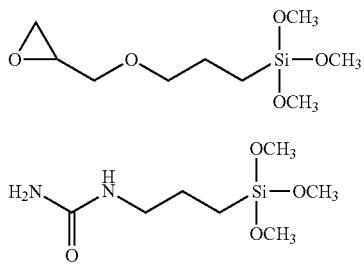

As (F) components, acryl resins of F1 and F2 were prepared by the methods of following Synthesis Examples 2 and 3.

Synthesis Example 2

Synthesis of an Acryl Resin F1

75 g of toluene and 75 g of isopropanol (IPA) were weighed in a 500-ml three-necked flask equipped with a stirrer, a nitrogen introducing tube and a thermometer; and separately weighed polymerizable monomers of 85 g of butyl acrylate (BA), 24 g of lauryl acrylate (DDA), 14 g of acrylic acid (AA) and 7.9 g of 1,2,2,6,6-pentamethylpiperidin-4-yl methacrylate (trade name: FA-711MM, made by Hitachi Chemical Co., Ltd.), and 0.13 g of azobisisobutyronitrile (AIBN) were added thereto. Dissolved oxygen was removed by making nitrogen gas flow at a flow volume of 400 ml/min for 30 min under stirring at a stirring rotation frequency of about 270 rpm at room temperature. Thereafter, the inflow of the nitrogen gas was stopped; and the flask was sealed, and heated to 65° C. over about 25 min in a constant-temperature water bath. The temperature was held for 14 hours to carry out the polymerization reaction to thereby obtain an acryl resin F1. The polymerization rate was 98%. The weight-average molecular weight (MW) of the acryl resin F1 as determined in terms of standard polystyrenes by GPC method is shown in Table 1.

Synthesis Example 3

Synthesis of an Acryl Resin F2

An acryl resin F2 was synthesized as in Synthesis Example 1, except for using polymerizable monomers shown in Table 1. The weight-average molecular weight of the synthesized acryl resin F2 is shown in Table 1.

TABLE 1

| (F) Acryl Resin | F1 | F2 |
|---|---|---|
| FA-711MM | 7.9 g (35 mmol) | 0.56 g (2.5 mmol) |
| FA-712HM | — | 0.74 g (3.5 mmol) |
| BA | 85 g (670 mmol) | 86 g (680 mmol) |
| DDA | 24 g (100 mmol) | — |
| AA | 14 g (200 mmol) | 14 g (200 mmol) |
| X-22-2475 | — | 15 g (36 mmol) |
| Weight-Average Molecular Weight | 36000 | 20000 |

FA-711MM: 1,2,2,6,6-pentamethylpiperidin-4-yl methacrylate (made by Hitachi Chemical Co., Ltd.)
FA-712HM: 2,2,6,6-tetramethylpiperidin-4-yl methacrylate (made by Hitachi Chemical Co., Ltd.)
BA: n-butyl acrylate
DDA: lauryl acrylate
X-22-2475: a methacryl-modified silicone oil (functional group equivalent: 420 g/mol, made by Shin-Etsu Chemical Co., Ltd.)

As an (I) component, ethyl lactate of I1 was prepared.

Examples 1 to 8, and Comparative Examples 1 and 2

The (A) to (I) components were blended in predetermined proportions shown in Table 2. The obtained solutions were subjected to a pressure filtration using a Teflon (R) filter of 3 µm in pore to thereby prepare solutions of the photosensitive resin compositions of Examples 1 to 8 and Comparative Examples 1 and 2.

<Evaluation of the Adherence>

The solutions of the photosensitive resin compositions of Examples 1 to 8 and Comparative Examples 1 and 2 were each spin coated on various types of substrates described below, and heated at 120° C. for 3 min to thereby form a resin film of about 11 to 12 µm in thickness. The resin film was heat treated (cured) in nitrogen at a temperature of 180° C. (temperature-rise time: 1.5 hours) for 2 hours by using a vertical diffusion oven (made by Koyo Thermo System Co., Ltd., trade name: "µ-TF") to thereby obtain a cured film of about 10 µm in thickness. The cured film was scored in a 10×10 grid by a razor by using a crosscut guide (made by Cotec Co., Ltd.) to thereby divide the cured film into 100 small pieces. A pressure-sensitive adhesive tape (made by Nichiban Co., Ltd.) was pasted thereon, and thereafter peeled off. The adherence was evaluated as follows by using the number of the small pieces peeled off the substrate when the pressure-sensitive adhesive tape was peeled off. The results are shown in Table 2.

A: no peeled-off small pieces
B: 1 to 25 peeled-off ones
C: 26 to 50 peeled-off ones
D: 51 to 75 peeled-off ones
C: 76 to 100 peeled-off ones The substrates used for the evaluation of the adherence were as follows.

Ti substrate: a substrate in which a Ti film was sputter-formed on a silicon substrate.
Au substrate: a substrate in which a TiN film was sputter-formed on a silicon substrate, and thereafter an Au film was further sputter-formed on the TiN film.
Cu substrate: a substrate in which a TiN film was sputter-formed on a silicon substrate, and thereafter a copper film was sputter-formed on the TiN film, and copper plating was carried out on the copper film as a seed layer.
Si substrate: a silicon substrate <Evaluation of Photosensitive Properties (Sensitivity and Resolution)>

The solutions of the photosensitive resin compositions obtained in Examples 1 to 8 and Comparative Examples 1 and 2 were each spin coated on the silicon substrate, and heated at 120° C. for 3 min to thereby form a resin film of about 8 to 9 µm in thickness. Then, the resin film was subjected to a reduction projection exposure using the i-line (365 nm) through a mask by using an i-line stepper (made by Canon Inc., trade name: "FPA-3000i"). After the exposure, the resin film was subjected to a development using a 2.38% aqueous solution of tetramethylammonium hydroxide (TMAH) so that the remaining film thickness became about 80 to 95% of the initial film thickness. Thereafter, the remaining film was rinsed with water; and the minimum exposure amount necessary for the pattern formation, and the size of the opened minimum square hole pattern were determined. The evaluation was carried out using the minimum exposure amount as the sensitivity and the size of the opened minimum square hole pattern as the resolution.

<Evaluation of Cured Film Properties (Elongation at Break and Elastic Modulus)>

The solutions of the photosensitive resin compositions obtained in Examples 1 to 8 and Comparative Examples 1 and 2 were each spin coated on the silicon substrate, and heated at 120° C. for 3 min to thereby form a resin film of about 12 to 14 μm in thickness. Then, the resin film was subjected to an exposure using the entire wavelength through a mask by using a proximity aligner (made by Canon Inc., trade name: "PLA-600FA"). After the exposure, the resin film was subjected to a development using a 2.38% aqueous solution of TMAH to thereby obtain a patterned resin film having a rectangular cross-section of 10 mm in width. Thereafter, the patterned resin film was heat treated (cured) in nitrogen at a temperature of 175° C. (temperature-rise time: 1.5 hours) for 2 hours by using a vertical diffusion oven (made by Koyo Thermo System Co., Ltd., trade name: "μ-TF") to thereby obtain a patterned cured film of about 10 μm in thickness. The cured film was peeled off the silicon substrate; and the peeled-off cured film was used as a sample, and measured for the elongation at break and the elastic modulus by "Autograph AGS-H100N" made by Shimadzu Corp. The width of the sample was 10 mm; the film thickness was about 10 μm; and the distance between chucks was made to be 20 mm. The tension rate was set at 5 mm/min; and the measurement temperature was made nearly at room temperature (20° C. to 25° C.). Averages of measurement values of 5 or more test pieces obtained from the cured film obtained in the same condition were taken as the elongation at break and the elastic modulus. The results are shown in Table 2.

<Evaluation of the Crack Resistance in a Thermal Shock Cycle Test>

A copper foil of a base material (trade name: E-679, made by Hitachi Chemical Co., Ltd.) for printed wiring boards in which the copper foil of 12 μm in thickness was laminated on a glass epoxy base material was etched to thereby obtain a test piece for the thermal shock resistance evaluation having an interdigital electrode in which the line width/the space width were 20 μm/20 μm; and mutual lines made no contact with each other and faced each other and were on the same surface. On the interdigital electrode of the test piece, the solutions of the photosensitive resin compositions of Examples 1 to 14 and Comparative Examples 1 and 2 were each applied using a spin coater to thereby obtain a resin film. The resin film was heat treated (cured) in nitrogen at a temperature of 175° C. (temperature-rise time: 1.5 hours) for 2 hours by using a vertical diffusion oven (made by Koyo Thermo System Co., Ltd., trade name: "μ-TF") to thereby obtain a cured film of about 10 μm in thickness. The test piece having this cured film was subjected to heat cycles of 1000 times each in which the test piece was exposed in the air at −55° C. for 15 min, thereafter heated at a temperature-rise rate of 180° C./min, then, exposed in the air at 125° C. for 15 min, and thereafter cooled at a temperature-fall rate of 180° C./min. Cracks and peeling of the cured film in the test piece after the exposure to the thermal shock cycle test were observed by a metallographical microscope at a magnification of 100×, and evaluated according to the following criterion. That is, the cured film having no crack nor peeling was designated as "A"; and the cured film exhibiting any crack or peeling was designated as "B". The results are shown in Table 2.

TABLE 2

| | | Examples | | | | | | | | | | | | | | Comparative Examples | |
|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 1 | 2 |
| (A) | A1 | 80 | 80 | 80 | 80 | 80 | 80 | 80 | 80 | 80 | 80 | 80 | 80 | 80 | 80 | 80 | 80 |
| | A2 | 20 | 20 | 20 | 20 | 20 | 20 | 20 | 20 | 20 | 20 | 20 | 20 | 20 | 20 | 20 | 20 |
| (B) | B1 | 10 | 10 | 10 | 10 | 10 | 10 | 10 | 10 | 10 | 10 | 10 | 10 | 10 | 10 | 10 | 10 |
| (C) | C1 | 10 | 10 | 10 | — | — | — | — | — | 10 | 10 | 10 | 10 | 10 | 10 | 10 | 10 |
| | C2 | — | — | — | 10 | 10 | 10 | 10 | — | — | — | — | — | — | — | — | — |
| | C3 | — | — | — | — | — | — | — | 10 | — | — | — | — | — | — | — | — |
| (D) | D1 | 3 | — | — | 3 | — | — | 3 | 3 | 0.2 | — | 1.2 | — | 4 | 4 | — | — |
| | D2 | — | 3 | — | — | 3 | — | — | — | — | 0.2 | — | 1.2 | 0.2 | 1.2 | — | — |
| | D3 | — | — | 3 | — | — | 3 | — | — | — | — | — | — | — | — | — | — |
| (E) | E1 | 3 | 3 | 3 | — | — | — | — | — | 3 | — | — | — | 3 | 3 | 3 | 3 |
| | E2 | — | — | — | 3 | 3 | 3 | 3 | 3 | — | — | — | — | — | — | — | — |
| (F) | F1 | 10 | 10 | 10 | 10 | — | — | — | — | 10 | 10 | 10 | 10 | 10 | 10 | 10 | — |
| | F2 | — | — | — | — | 10 | 10 | 10 | 10 | — | — | — | — | — | — | — | 10 |
| (I) | I1 | 160 | 160 | 160 | 160 | 160 | 160 | 160 | 160 | 160 | 160 | 160 | 160 | 160 | 160 | 160 | 160 |
| Adherence | Au | A | A | A | A | A | A | A | A | A | A | A | A | A | A | B | B |
| | Cu | B | A | B | B | A | A | A | A | A | A | A | A | A | A | E | E |
| | Ti | A | A | A | A | B | B | B | B | A | B | B | B | A | A | C | C |
| | Si | A | A | A | A | A | A | A | A | A | B | B | B | A | A | A | A |
| Sensitivity (mJ/cm$^2$) | | 180 | 400 | 400 | 420 | 400 | 410 | 400 | 400 | 400 | 400 | 400 | 400 | 400 | 400 | 400 | 500 |
| Resolution (μm) | | 7 | 7 | 7 | 30 | 30 | 30 | 30 | 30 | 7 | 10 | 10 | 10 | 10 | 10 | 10 | 40 |
| Elongation at Break (%) | | 15 | 22 | 23 | 20 | 17 | 25 | 25 | 23 | 20 | 23 | 25 | 23 | 24 | 24 | 24 | 25 |
| Elastic Modulus (GPa) | | 2.8 | 2.4 | 2.4 | 2.4 | 2.8 | 2.4 | 2.4 | 2.5 | 2.4 | 2.4 | 2.4 | 2.4 | 2.4 | 2.4 | 2.4 | 2.4 |
| Crack Resistance | | A | A | A | A | A | A | A | A | A | A | A | A | A | A | B | B |

The photosensitive resin compositions of Examples 1 to 8 could provide patterned cured films exhibiting the good crack resistance and having the good adherence with any one of the substrates. In the cases of using the photosensitive resin compositions of Examples 1 to 8, the photosensitive properties and the mechanical properties were good as well. By contrast, in either case of Comparative Example 1 and Comparative Example 2 in which no nitrogen-containing aromatic compound is used, the adherence with the substrate decreased and the crack resistance was poor.

INDUSTRIAL APPLICABILITY

The present invention can provide a photosensitive resin composition which is capable of forming a patterned cured film having excellent crack resistance and having good adherence with any substrate regardless of the type of the substrate, and which is developable with an alkali aqueous solution.

REFERENCE SIGNS LIST

1 . . . SEMICONDUCTOR SUBSTRATE, 2 . . . PROTECTING FILM, 3 . . . FIRST CONDUCTOR LAYER, 4 . . . INTERLAYER INSULATING LAYER, 5 . . . PHOTOSENSITIVE RESIN LAYER, 6A, 6B, 6C . . . WINDOW PART, 7 . . . SECOND CONDUCTOR LAYER, 8 . . . SURFACE PROTECTING LAYER, 11 . . . INTERLAYER INSULATING FILM, 12 . . . WIRING LAYER, 12 . . . UNDERFILL, 13 . . . INSULATING LAYER, 14 . . . SURFACE PROTECTING LAYER, 15 . . . PAD PART, 16 . . . REWIRING LAYER, 17 . . . CONDUCTIVE BALL, 18 . . . CORE, 19 . . . COVER COAT LAYER, 20 . . . BARRIER METAL, 21 . . . COLLAR, 22 . . . UNDERFILL, 23 . . . SILICON CHIP, 24 . . . CONNECTION PART, 100, 200, 300, 400 . . . STRUCTURAL BODY, 500 . . . SEMICONDUCTOR APPARATUS, 600 . . . SEMICONDUCTOR APPARATUS, and 700 . . . SEMICONDUCTOR APPARATUS

The invention claimed is:

1. A photosensitive resin composition, comprising:
 (A) an alkali-soluble resin;
 (B) a compound which generates an acid when exposed to light;
 (C) a thermal crosslinking agent;
 (D) an acryl resin;
 (E) a nitrogen-containing aromatic compound represented by the following formula (1),

[Chemical Formula 1]

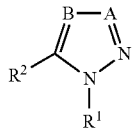

(1)

wherein $R^1$ represents a hydrogen atom or a hydrocarbon group; $R^2$ represents a hydrogen atom, an amino group or a phenyl group; and A and B each independently represent a nitrogen atom, or a carbon atom and a hydrogen atom bonded thereto.

2. The photosensitive resin composition according to claim 1, wherein the (E) component is a nitrogen-containing aromatic compound represented by the following formula (2):

[Chemical Formula 2]

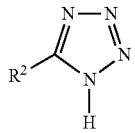

(2)

wherein $R^2$ represents a hydrogen atom, an amino group or a phenyl group.

3. The photosensitive resin composition according to claim 2, wherein the nitrogen-containing aromatic compound represented by the formula (2) is selected from the group consisting of 1H-tetrazole and 5-aminotetrazole.

4. The photosensitive resin composition according to claim 2, wherein the nitrogen-containing aromatic compound represented by the formula (2) is 5-aminotetrazole.

5. The photosensitive resin composition according to claim 1, wherein the (A) component is a phenol resin.

6. The photosensitive resin composition according to claim 5, wherein the (A) component comprises a phenol resin (A1) having no unsaturated hydrocarbon group and a modified phenol resin (A2) having an unsaturated hydrocarbon group.

7. The photosensitive resin composition according to claim 6, wherein the (A2) component is a modified phenol resin further modified by a reaction of a phenolic hydroxyl group with a polybasic acid anhydride.

8. The photosensitive resin composition according to claim 1, wherein the (B) component is an o-quinone diazide compound.

9. The photosensitive resin composition according to claim 1, further comprising (F) a silane compound represented by the following formula (3):

[Chemical Formula 3]

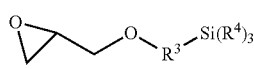

(3)

wherein $R^3$ represents a divalent organic group; and $R^4$ represents a monovalent organic group, and a plurality of $R^4$ in the same molecule may be identical or different.

10. The photosensitive resin composition according to claim 9, wherein the silane compound represented by the formula (3) is 3-glycidoxypropyltrimethoxysilane.

11. A method for manufacturing a patterned cured film, the method comprising the steps of:
 (1) applying and drying the photosensitive resin composition according to claim 1 on a substrate to thereby form a photosensitive resin film;
 (2) exposing the photosensitive resin film;
 (3) developing the photosensitive resin film after the exposure by using an alkali aqueous solution to thereby form a patterned resin film; and
 (4) heating the patterned resin film.

12. An electronic component, having a patterned cured film obtained by the method according to claim 11 as a surface protecting layer or an interlayer insulating layer.

13. An electronic component, having a patterned cured film obtained by the method according to claim 11 as a cover coat layer, a core, a collar or an underfill.

* * * * *